(12) United States Patent
Lubomirsky et al.

(10) Patent No.: US 12,548,742 B2
(45) Date of Patent: *Feb. 10, 2026

(54) CORROSION RESISTANT GROUND SHIELD OF PROCESSING CHAMBER

(71) Applicant: Applied Materials, Inc., Santa Clara, CA (US)

(72) Inventors: Dmitry Lubomirsky, Cupertino, CA (US); Xiao Ming He, Fremont, CA (US); Jennifer Y. Sun, Mountain View, CA (US); Xiaowei Wu, San Jose, CA (US); Laksheswar Kalita, San Jose, CA (US); Soonam Park, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 488 days.

This patent is subject to a terminal disclaimer.

(21) Appl. No.: 18/067,632

(22) Filed: Dec. 16, 2022

(65) Prior Publication Data

US 2023/0122695 A1 Apr. 20, 2023

Related U.S. Application Data

(63) Continuation of application No. 16/212,580, filed on Dec. 6, 2018, now Pat. No. 11,562,890.

(51) Int. Cl.
*H01J 37/32* (2006.01)
*C23C 16/458* (2006.01)
*C23C 16/46* (2006.01)

(52) U.S. Cl.
CPC .... *H01J 37/32697* (2013.01); *C23C 16/4581* (2013.01); *C23C 16/4583* (2013.01);
(Continued)

(58) Field of Classification Search
USPC .................................. 118/725; 156/345.52
See application file for complete search history.

(56) References Cited

U.S. PATENT DOCUMENTS

| 5,387,888 A | 2/1995 | Eda et al. |
| 6,069,346 A | 5/2000 | Hyllberg |

(Continued)

FOREIGN PATENT DOCUMENTS

| JP | H10-204945 A | 8/1998 |
| JP | H11-343571 A | 12/1999 |

(Continued)

*Primary Examiner* — Ram N Kackar
(74) *Attorney, Agent, or Firm* — Lowenstein Sandler LLP

(57) ABSTRACT

A ground shield of a processing chamber includes a ceramic body including a ground shield plate, a raised edge extending from an upper surface of the ground shield plate, and a hollow shaft that extends from a lower surface of the ground shield plate. An electrically conductive layer is formed on and conforms to at least the upper surface of the ground shield plate and an interior surface of the hollow shaft. A first protective layer is formed on at least the electrically conductive layer. A heater plate of a heater first within the raised edge and on the ground shield plate such that the heater plate is disposed on top of the first protective layer, the electrically conductive layer, and the upper surface of the ground shield plate.

20 Claims, 9 Drawing Sheets

(52) U.S. Cl.
CPC ........ *C23C 16/46* (2013.01); *H01J 37/32724* (2013.01); *H01J 2237/2001* (2013.01); *H01J 2237/3323* (2013.01)

(56) References Cited

U.S. PATENT DOCUMENTS

| | | | |
|---|---|---|---|
| 8,017,062 B2 | 9/2011 | Narendar et al. | |
| 8,191,505 B2 | 6/2012 | Kamaishi et al. | |
| 9,034,471 B2 | 5/2015 | Grau | |
| 9,034,771 B1 | 5/2015 | Nangoy | |
| 9,153,463 B2 | 10/2015 | Futakuchiya | |
| 9,460,898 B2 | 10/2016 | Kim et al. | |
| 9,583,369 B2 | 2/2017 | Sun et al. | |
| 9,633,884 B2 | 4/2017 | He et al. | |
| 9,850,573 B1 | 12/2017 | Sun | |
| 9,869,013 B2 | 1/2018 | Sun et al. | |
| 9,887,121 B2 | 2/2018 | Parkhe | |
| 2003/0029564 A1 | 2/2003 | Brown et al. | |
| 2003/0029568 A1 | 2/2003 | Brown et al. | |
| 2004/0168767 A1* | 9/2004 | Kanno | H01L 21/67248 156/345.52 |
| 2005/0145617 A1* | 7/2005 | McMillin | H05B 3/28 219/544 |
| 2008/0141942 A1 | 6/2008 | Brown et al. | |
| 2009/0095733 A1 | 4/2009 | Komatsu | |
| 2009/0302437 A1 | 12/2009 | Kim et al. | |
| 2010/0018648 A1 | 1/2010 | Collins et al. | |
| 2010/0210115 A1 | 8/2010 | Hara et al. | |
| 2013/0134147 A1* | 5/2013 | Futakuchiya | H01L 21/67109 219/444.1 |
| 2014/0011038 A1 | 1/2014 | Das et al. | |
| 2014/0116338 A1 | 5/2014 | He et al. | |
| 2014/0117120 A1 | 5/2014 | He et al. | |
| 2014/0165915 A1* | 6/2014 | Raj | H01L 21/68792 219/544 |
| 2015/0307982 A1* | 10/2015 | Firouzdor | C23C 16/4581 427/523 |
| 2015/0311043 A1 | 10/2015 | Sun et al. | |
| 2015/0311044 A1 | 10/2015 | Sun et al. | |
| 2017/0125274 A1 | 5/2017 | Swaminathan et al. | |
| 2017/0260616 A1 | 9/2017 | Lee et al. | |
| 2017/0306494 A1* | 10/2017 | Lin | H01J 37/32082 |
| 2017/0323772 A1 | 11/2017 | Fenwick et al. | |
| 2018/0016678 A1 | 1/2018 | Fenwick et al. | |
| 2018/0037515 A1 | 2/2018 | Matsumoto et al. | |
| 2018/0337026 A1 | 11/2018 | Firouzdor et al. | |

FOREIGN PATENT DOCUMENTS

| | | |
|---|---|---|
| JP | 2002-013874 A | 1/2002 |
| JP | 2002057207 A | 2/2002 |
| JP | 2008-021963 A | 1/2008 |
| JP | 2011-525719 A | 9/2011 |
| JP | 2011-529273 A | 12/2011 |
| JP | 2014013874 A | 1/2014 |
| JP | 2016-508288 A | 3/2016 |
| JP | 2017-514991 A | 6/2017 |
| JP | 2017-538278 A | 12/2017 |
| KR | 20110041541 A | 4/2011 |
| TW | 201324677 A | 6/2013 |
| TW | 201601937 A | 1/2016 |
| TW | 201840892 A | 11/2018 |
| WO | 9908311 A1 | 2/1999 |
| WO | 2005/062758 A2 | 7/2005 |

* cited by examiner

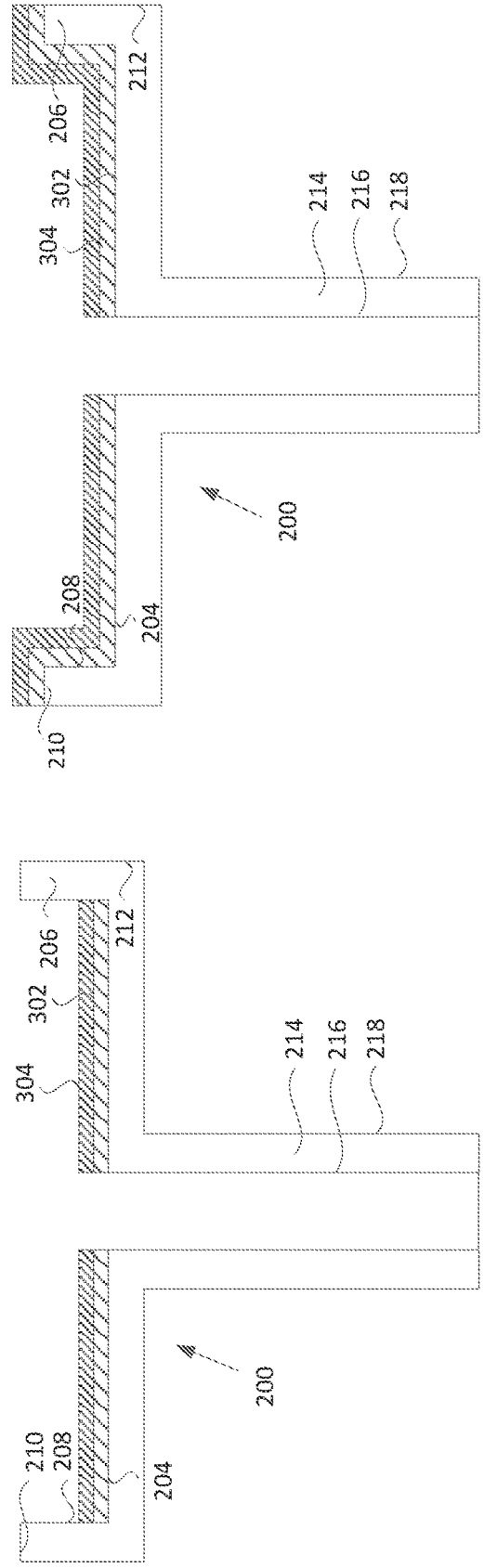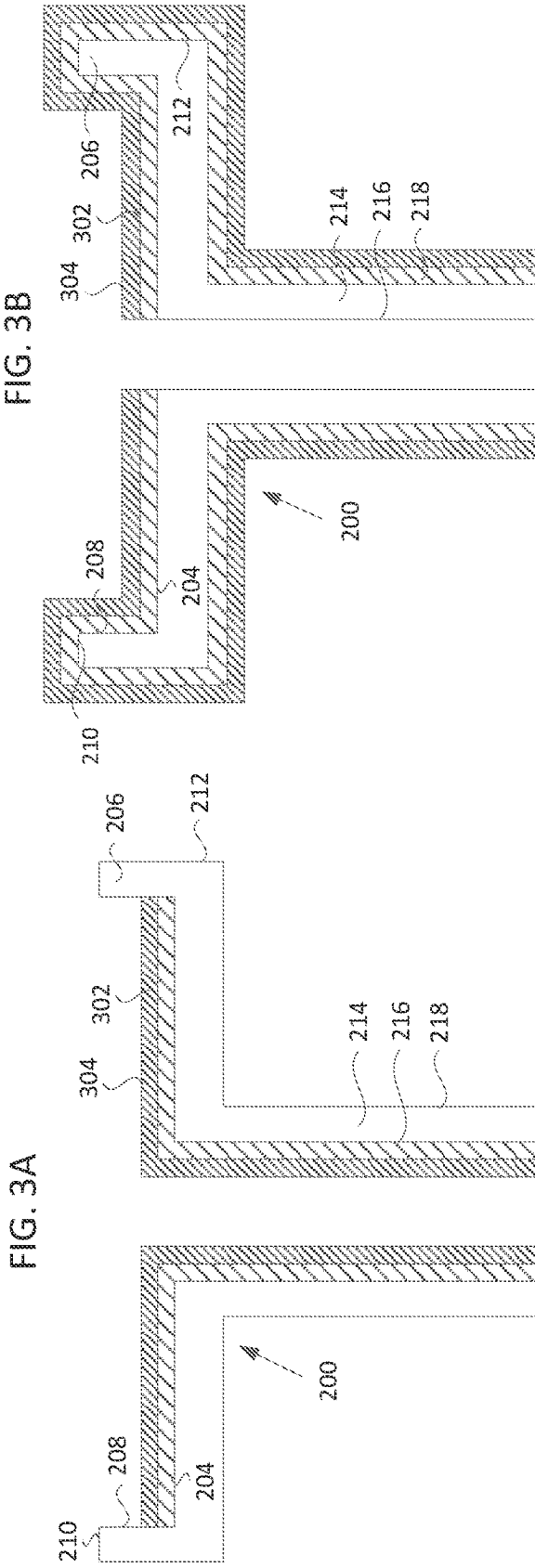

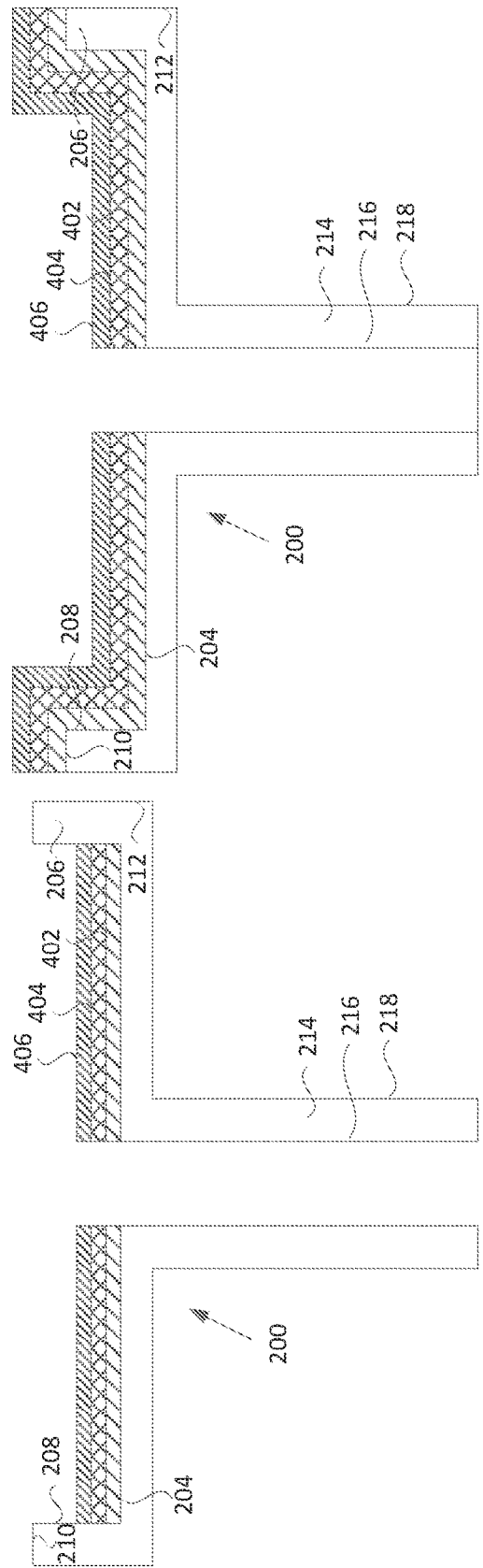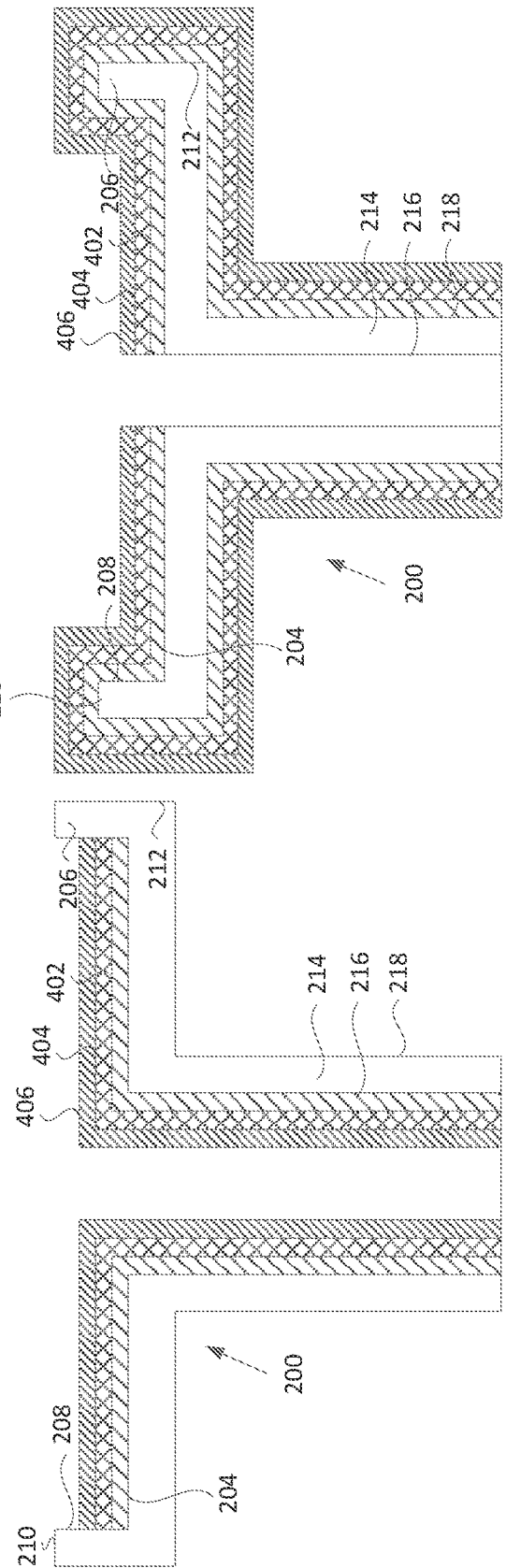

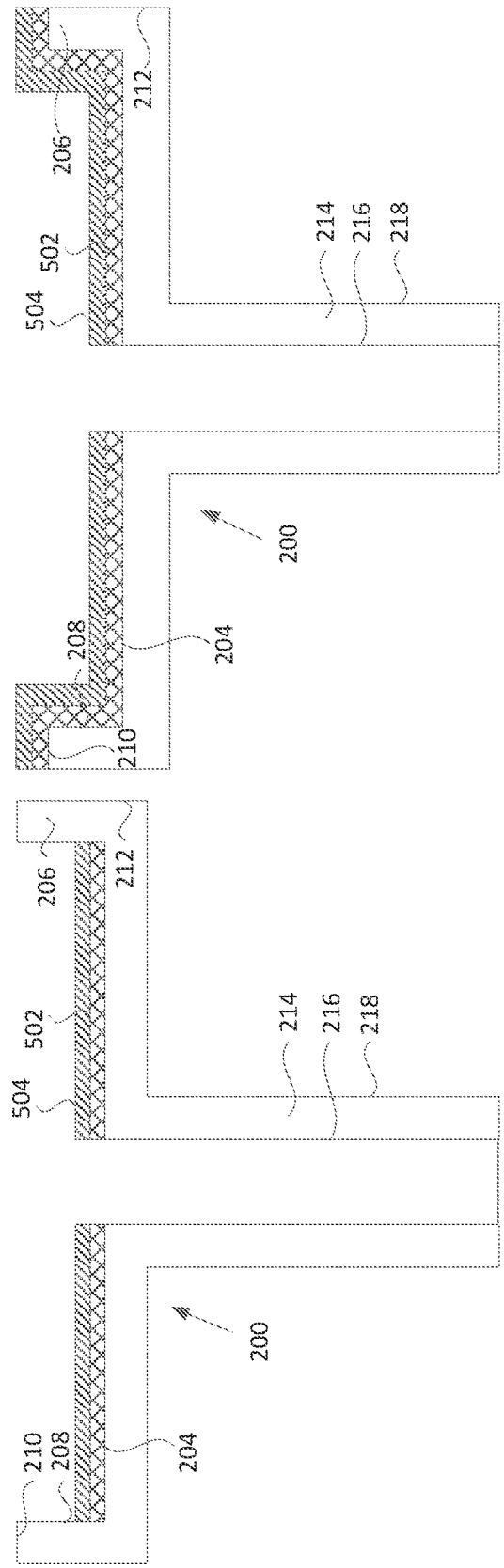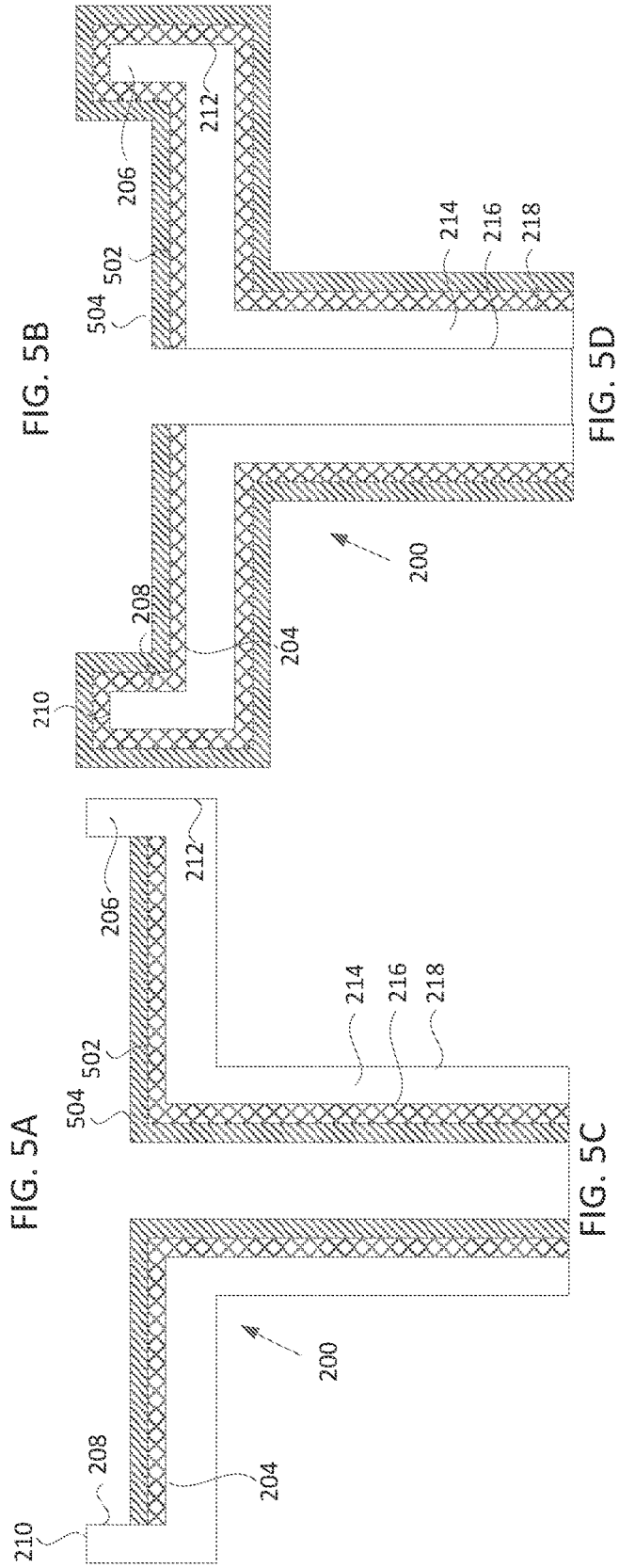

CORROSION RESISTANT GROUND SHIELD OF PROCESSING CHAMBER

CROSS REFERENCE TO RELATED APPLICATIONS

This application is a continuation of U.S. application Ser. No. 16/212,580, filed Dec. 6, 2018, which is incorporated by reference in its entirety herein.

TECHNICAL FIELD

Embodiments of the present disclosure relate, in general, to a ground shield for a heater that can allow for uniformity in the formation of biased plasma, and, in particular, to a ground shield that is resistant to corrosion and/or erosion (e.g., such caused by a plasma environment).

BACKGROUND

In the semiconductor industry, heaters are used to support substrates and to heat those substrates during processing, such as during deposition processes and/or etch processes that use plasma. A radio frequency (RF) field may be introduced to a substrate processing apparatus to facilitate oscillation between the heater and other components of the processing unit, which aids in the use of plasma. Ground shields may be used to help ground the heater to allow for greater uniformity of a plasma during this processing. Current ground shields are made of aluminum or stainless steel materials, and are coated with a protective coating that has a coefficient of thermal expansion (CTE) that is very different from a CTE of the aluminum or stainless steel. Because of the significantly different CTE values between aluminum or stainless steel materials and traditional protective coatings on the ground shield, the protective coating frequently cracks, exposing the aluminum or stainless steel material to a corrosive environment and/or to plasma. This prevents existing ground shields from being used in biased, high temperature applications.

SUMMARY

In one embodiment, a ground shield of a processing chamber includes a ceramic body comprising a plate and a raised edge extending from an upper surface of the plate. A heater fits within the raised edge on the upper surface of the plate. The ground shield further includes an electrically conductive layer on at least the upper surface of the plate, and a first protective layer on at least the electrically conductive layer.

In one embodiment, a substrate support assembly of a processing chamber includes a heater, and a ground shield comprising a disc-shaped ceramic body and a shaft that extends from a lower surface of the disc-shaped ceramic body. An upper surface of the disc-shaped ceramic body comprises a raised edge that extends from an upper surface of the disc-shaped ceramic body. The heater is disposed on the upper surface of the disc-shaped ceramic body within the raised edge. The ground shield further includes an electrically conductive layer on at least the upper surface of the disc-shaped ceramic body, and a first protective layer on at least the electrically conductive layer.

In one embodiment a ground shield of a processing chamber includes an electrically conductive body including a plate and a raised edge extending from an upper surface of the plate. A heater fits within the raised edge on the upper surface of the plate. The raised edge includes an edge interior wall, an edge upper surface, and an edge exterior wall, a first protective layer on at least the upper surface of the plate, and a second protective layer on at least the first protective layer.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 3A depicts a sectional view of one embodiment of a ceramic ground shield assembly comprising an electrically conductive layer and a first protective layer.

FIG. 3B depicts another sectional view of one embodiment of a ceramic ground shield assembly comprising an electrically conductive layer and a first protective layer.

FIG. 3C depicts another sectional view of one embodiment of a ceramic ground shield assembly comprising an electrically conductive layer and a first protective layer.

FIG. 3D depicts another sectional view of one embodiment of a ceramic ground shield assembly comprising an electrically conductive layer and a first protective layer.

FIG. 4A depicts a sectional view of one embodiment of a ceramic ground shield assembly comprising an electrically conductive layer, a first protective layer, and a second protective layer.

FIG. 4B depicts another sectional view of one embodiment of a ceramic ground shield assembly comprising an electrically conductive layer, a first protective layer, and a second protective layer.

FIG. 4C depicts another sectional view of one embodiment of a ceramic ground shield assembly comprising an electrically conductive layer, a first protective layer, and a second protective layer.

FIG. 4D depicts another sectional view of one embodiment of a ceramic ground shield assembly comprising an electrically conductive layer, a first protective layer, and a second protective layer.

FIG. 5A depicts a sectional view of one embodiment of an electrically conductive ground shield assembly comprising a first protective layer and a second protective layer.

FIG. 5B depicts another sectional view of one embodiment of an electrically conductive ground shield assembly comprising a first protective layer and a second protective layer FIG. 5C depicts another sectional view of one embodiment of an electrically conductive ground shield assembly comprising a first protective layer and a second protective layer.

FIG. 5D depicts another sectional view of one embodiment of an electrically conductive ground shield assembly comprising a first protective layer and a second protective layer.

DETAILED DESCRIPTION OF EMBODIMENTS

Figure 1:
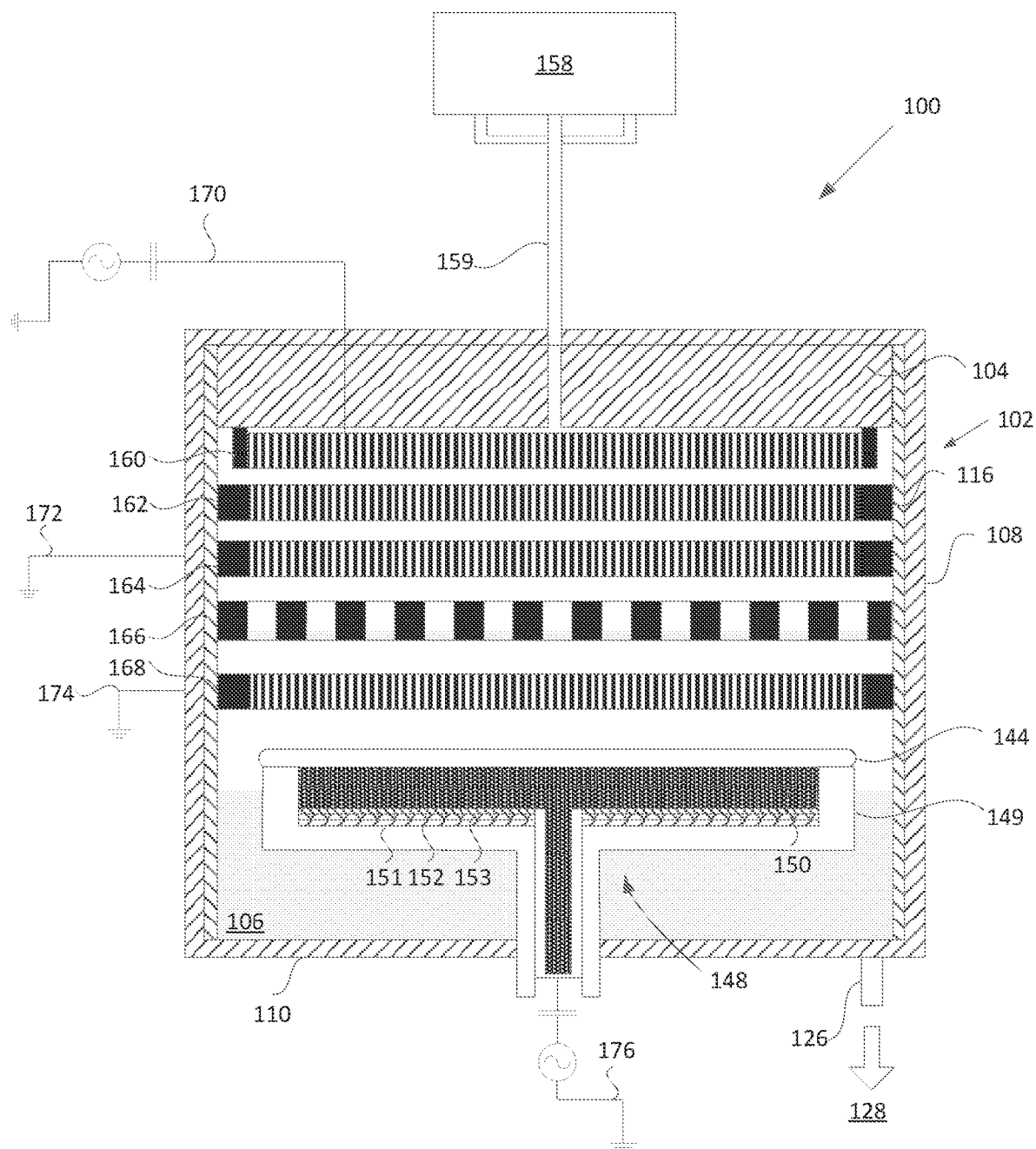
FIG. 1 depicts a sectional view of one embodiment of a processing chamber.

Embodiments of the present disclosure provide a ground shield as well as a substrate support assembly having a ground shield and a heater surrounded by the ground shield. The ground shield includes a plate and a raised edge extending from the upper surface of the plate, where the raised edge includes an edge interior wall, an upper edge surface, and an edge exterior wall. The ground shield also includes a hollow shaft extending from the lower surface of the plate. The hollow surface includes an interior wall and an exterior wall.

In one embodiment, the ground shield may be composed of a ceramic material and an electrically conductive layer may be deposited onto at least the upper surface of the plate. A first protective layer may be deposited on the electrically conductive layer. A second layer may be deposited on the first protective layer. By depositing the electrically conductive layer on the ceramic ground shield body, the ground shield is able to provide a grounding function to the heater. The first protective layer and/or the second protective layer may protect the ground shield from a high oxidation and/or a corrosive environment. For example, the first protective layer and/or second protective layer may be resistant to oxidation as well as erosion and/or corrosion from plasma and/or a corrosive chemistry (e.g., fluorine-rich environment and/or chlorine-rich environment). The first protective layer may be strategically chosen such that the CTE value for the first protective layer and the CTE value for the ceramic material are substantially similar, or within a suitable difference (e.g., within $2.5 \times 10^{-6}/°$ C.), so to prevent cracking of the first protective layer during substrate processing. By strategically choosing the ceramic material and the first protective layer to avoid CTE mismatch, the ground shield of the present disclosure may be used in biased, high temperature applications.

In another embodiment, the ground shield may be composed of an electrically conductive material. A first protective layer may be deposited on at least the upper surface of the plate of the ground shield. A second protective layer may be deposited on the first protective layer. The ground shield may be able to provide a grounding function to the heater without being damaged by a high oxidation or corrosive processing environment. The first protective layer and the second protective layer may protect the ground shield from the high oxidation or corrosive environment. The electrically conductive material and the first protective layer may be strategically chosen such that CTE value for the electrically conductive material and the CTE value for the first protective layer are substantially similar, or within a suitable difference, ($2.5 \times 10^{-6}/°$ C.), so to avoid cracking of the first protective layer during substrate processing. By strategically choosing the electrically conductive material and the first protective layer to avoid CTE mismatch, the ground shield of the present disclosure may be used in biased, high temperature applications.

FIG. 1 illustrates a sectional view of a processing chamber 100 (e.g., a semiconductor processing chamber) having one or more chamber components. Processing chamber 100 may be used, for example, for semiconductor manufacturing processes, display manufacturing processes, micro-electrical mechanical system (MEMS) manufacturing processes, photovoltaic manufacturing processes, and so on. For example, processing chamber 100 may be a chamber for a plasma etcher or a plasma etch reactor, a plasma cleaner, a chemical vapor deposition (CVD) reactor, a physical vapor deposition (PVD) reactor, an atomic layer deposition (ALD) reactor, and so forth.

In one embodiment, processing chamber 100 may include a chamber body 102 that encloses an interior volume 106. Chamber body 102 may be fabricated from aluminum, stainless steel or other suitable material. Chamber body 102 generally includes a lid 104, sidewalls 108, and a bottom 110. An outer liner 116 may be disposed adjacent the sidewalls 108 to protect chamber body 102. In one embodiment, outer liner 116 may be fabricated from aluminum oxide.

An exhaust port 126 may be defined in chamber body 102, and may couple the interior volume 106 to a pump system 128. Pump system 128 may include one or more pumps and throttle valves utilized to evacuate and regulate the pressure of interior volume 106 of processing chamber 100.

A gas panel 158 may be coupled to processing chamber 100 to provide process and/or cleaning gases to interior volume 106 through one or more intermediate components.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, NF, $Cl_2$, $CCl_4$, $BCl_4$, and $SiF_4$, among others, and other gases such as $O_2$, $NH_3$, $H_2$, or $N_2O$. Examples of carrier gases include $N_2$, He, Ar, and other gases inert to process gases (e.g., non-reactive gases).

Processing chamber 100 may include multiple showerheads, faceplates and/or gas distribution plates, which may be arranged in series. A showerhead 160 may be defined in chamber body 102 and may be coupled to and/or proximate to lid 104. Alternatively, lid 104 may be replaced by showerhead 160. Showerhead 160 may be positioned within processing chamber 100 as illustrated, and may be included or positioned between lid 104 and a substrate support assembly 148. In embodiments, showerhead 160 may be or include a metallic or conductive component that is a coated, seasoned or otherwise treated material. Exemplary materials may include metals, including aluminum, as well as metal oxides, including aluminum oxide. Depending on the precursors being utilized, or the process being performed within processing chamber 100, the showerhead 160 may be any other metal that may provide structural stability as well as electrical conductivity.

Showerhead 160 may define one or more apertures to facilitate uniform distribution of precursors and/or plasma through showerhead 160. The apertures may be included in a variety of configurations and patterns, and may be characterized by any number of geometries that may provide precursor and/or plasma distribution as may be desired. Showerhead 160 may be electrically coupled with a power source in embodiments. For example, showerhead 160 may be coupled with an RF source 170. When operated, RF source 170 may provide a current to showerhead 160 allowing inductively-coupled plasma (ICP) or conductively coupled plasma (CCP) to be formed between showerhead 160 and another component.

Chamber body 102 may also include a face plate 162. Faceplate 162 may be similar to the showerhead 160. Faceplate 162 may be positioned within processing chamber 100 between showerhead 160 and substrate support assembly 148. Faceplate 162 may include a plurality of channels or apertures defined through faceplate 162. Faceplate 162 may be or include an insulative material. In one embodiment, faceplate 162 may be quartz or any material that may have reduced interaction with oxygen-containing plasma effluents, such as a reduced impact on oxygen, or oxygen radical, recombination as compared to metal oxide components.

A second showerhead 164 may be defined in chamber body 102 and may operate as an additional electrode with showerhead 160. Showerhead 164 may include any of the features or characteristics of showerhead 160 discussed previously. In other embodiments, certain features of showerhead 164 may diverge from the showerhead 160. For example, showerhead 164 may be coupled with an electrical ground 172, which may allow ICP or CCP to be generated between showerhead 160 and showerhead 164. In one embodiment, ICP or CCP may be generated between showerhead 160 and faceplate 162. Showerhead 164 may define apertures within the structure to allow precursors or plasma effluents to be delivered to a substrate 144 during processing.

A gas distribution assembly 166 may optionally be defined in chamber body 102. In some embodiments, there may be no components between showerhead 164 and substrate support assembly 148, and showerhead 164 may allow distribution of precursors and/or plasma effluents to a substrate 144 during processing. Gas distribution assembly 166 may be located within the chamber body 102 above substrate support assembly 148 and lid 104, as well as between substrate support assembly 148 and showerhead 164. Gas distribution assembly 166 may be configured to deliver both a first and second precursor to substrate support assembly 148.

In one embodiment, gas distribution assembly 166 may be configured to have two or more gas feeding channels, to allow a precursor and/or plasma delivered by a showerhead 164 to pass through gas distribution assembly 166 and access substrate support assembly 148. In another embodiment, gas distribution assembly 166 may allow a precursor and/or plasma from another source, (e.g., a remote plasma source (not shown)) to pass through gas distribution assembly 166 and access substrate support assembly 148.

A second faceplate 168 may be defined in chamber body 102. In some embodiments, faceplate 168 may provide similar functionality, and include similar characteristics, as faceplate 162, or showerheads 160, 164. Substrate support assembly 148 may be coupled with an RF source 176. In particular, the ground shield of substrate support assembly 148 may be coupled with RF source 176. Faceplate 168 may be coupled with an electrical ground 174. When operated, RF source 176 may provide a current to substrate support assembly 148 allowing biased plasma to be formed between faceplate 168 and substrate 144. Faceplate 168 may be coupled with an electrical ground 174 in embodiments.

Substrate support assembly 148 may be disposed in interior volume 106 of processing chamber 100 below a showerhead and/or gas diffuser 160. Substrate support assembly 148 may hold a substrate 144 during processing. In one embodiment, the substrate support assembly 148 may include a ground shield 149 and a heater 150. Heater 150 may include heater body that includes a plate or disc and a shaft (e.g., a cylindrical shaft) that extends from a lower surface of the disc or plate. Ground shield 149 may include a ground shield body that includes a plate or disc and a shaft that extends from a lower surface of the plate or disc. The shaft of the ground shield 149 may be a hollow shaft, and the shaft of the heater 150 may be disposed inside of the hollow shaft of the ground shield 149. The ground shield body may additionally include a raised edge extending from an upper surface of the plate or disc (e.g., a ring at a periphery of the plate). The plate of heater 150 may rest inside of the raised edge of ground shield 149, and raised edge of the ground shield 149 may protect side walls of heater 150.

In one embodiment, heater 150 is composed of AlN (aluminum nitride). Alternatively, heater 150 may be composed of SiC (silicon carbide), or other materials. In one embodiment, heater 150 may include one or more resistive heating elements disposed in the heater body. In one embodiment, the one or more resistive heating elements may be disposed in the plate.

Heater 150 may heat substrate 144 to working temperatures of 450° C., 500° C., or higher during processing. Traditional ground shields are composed of aluminum or stainless steel, and include a coating of plasma sprayed $Y_2O_3$ (yttria or yttrium oxide). However, the aluminum or stainless steel of the traditional ground shields have much higher CTE values than the CTE of $Y_2O_3$. For example, aluminum has a CTE of about 21-24106/° C., stainless steel has a CTE of between about 7.6 and 17.3 $10^{-6}$/° C., and $Y_2O_3$ has a CTE of 7.2 $10^{-6}$/° C. This mismatch in CTE values causes the $Y_2O_3$ coating to crack and delaminate from the body of the traditional ground shield at working temperatures of 450° C. or above.

Accordingly, in some embodiments at least the plate of ground shield 149 is composed of a bulk ceramic material. The shaft of ground shield 149 may be the same ceramic material or may be a different material than the material used for the plate. Examples ceramic materials that may be used for the plate of the ground shield (and optionally the shaft of the ground shield) may include $Al_2O_3$ (alumina), AlN, Si (silicon), SiC, SiN (silicon nitride), $Y_3Al_5O_{12}$ (YAG), $Y_4Al_2O_9$ (YAM), $Y_5O_4F_7$, $Y_2O_3$, $Er_2O_3$, $Gd_2O_3$, $Gd_3Al_5O_{12}$ (GAG), $YF_3$, $YAlO_3$ (YAP), $Nd_2O_3$, $Er_4Al_2O_9$ (EAM), $Er_3Al_5O_{12}$ (EAG), $ErAlO_3$ (EAP), $Gd_4Al_2O_9$ (GAM), $GdAlO_3$ (GAP), $Nd_3Al_5O_{12}$, $Nd_4Al_2O_9$, $NdAlO_3$, or a ceramic compound composed of $Y_4Al_2O_9$ and a solid solution of $Y_2O_3$—$ZrO_2$.

In order to provide RF grounding (and thus function as a ground shield), ground shield 149 should include an electrically conductive component. Accordingly, ground shield 149 may include an electrically conductive layer 151 on at least an upper surface of the plate of ground shield 150. Electrically conductive layer 151 may be composed of Mo (Molybdenum), W (Tungsten), Ta (Tantalum), Ni (Nickel), Hastelloy® (an alloy of nickel, molybdenum, and chromium), Inconel® (an alloy of nickel, chromium, and iron), Ti (titanium), a Ti alloy (e.g., TC4), ITO (indium tin oxide), etc. As used herein, the term electrically conductive layer means a layer having an electrical resistivity of 5 Ω·cm or less at a temperature between about 20° C. to about 800° C. Electrically conductive layer 151 may be a solid layer or may be a patterned or printed layer (e.g., having one or more patterns, such as a web-like pattern, a grid pattern, a bullseye pattern, a spiral pattern, and so on). Electrically conductive layer 151 may be connected to ground at one or multiple points, as described further below. Since ground shield 149 provides RF grounding, it may have multiple paths to ground to minimize parasitic capacitance and/or inductance and to present an equivalent low impedance at frequencies of interest at various points on ground shield 149.

Electrically conductive layer 151 is coated with a first protective layer 152. First protective layer 152 may be thicker than electrically conductive layer 151 and may be composed of a material that has a CTE that is close to the CTE of the body of ground shield 149. First protective layer 152 may be composed of conductive or non-conductive metals, alloys, ceramics, and other composited materials. First protective layer 152 may have good oxidation resistance and may be plasma resistant at temperatures of 450° C. or above. In embodiments, first protective layer 152 may be composed of $Al_2O_3$, $Y_2SiO_5$, $Y_2Si_2O_7$, Ta, a titanium alloy (e.g., TC4), SiC, $Y_2O_3$, $Y_4Al_2O_9$, $Y_3Al_5O_{12}$, $YAlO_3$, $Y_5O_4F_7$, Quartz, $Si_3N_4$, AlN, AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ).

First protective layer 152 may be coated with a second protective layer 153. Second protective layer 153 may be a thin layer that seals any cracks and/or pores in first protective layer 152. Second protective layer 153 may be composed of $Y_2SiO_5$, $Y_2Si_2O_7$, Ta, a titanium alloy (e.g., TC, TC4), SiC, $Y_4Al_2O_9$, $Y_3Al_5O_{12}$, $YAlO_3$, $Y_5O_4F_7$, Quartz, $Si_3N_4$, AlN, AlON, $TiO_2$, $ZrO_2$, TiC, ZrC, TIN, TiCN, $Y_2O_3$ stabilized $ZrO_2$ (YSZ), and so on. Second protective layer 153 may also be composed of a ceramic composite such as $Y_3Al_5O_{12}$ distributed in $Al_2O_3$ matrix, $Y_2O_3$—$ZrO_2$ solid solution or a SiC—$Si_3N_4$ solid solution.

Other example compositions for first protective layer 152 and/or second protective layer 153 include $Y_2O_3$, $Al_2O_3$, $Er_2O_3$, $YF_3$, $Er_3Al_5O_{12}$, Y—O—F (e.g., $Y_5O_4F_7$), $Er_3Al_5O_{12}$, $Er_4Al_2O_9$, $ErAlO_3$, a solid solution of $Y_2O_3$—$ZrO_2$, and a ceramic compound comprising $Y_4Al_2O_9$ and a solid-solution of $Y_2O_3$—$ZrO_2$.

With reference to the solid-solution of $Y_2O_3$—$ZrO_2$, first protective layer 152 and/or second protective layer 153 may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40% $ZrO_2$. May include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 mol % $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the ground shield body of ground shield 149. In one embodiment, the alternative ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and $SiO_2$ in a range of 5-15 mol %. In another embodiment, the alternative ceramic compound can include $Y_2O_3$ in a range of 30-60 mol %, $ZrO_2$ in a range of 0-20 mol %, $Er_2O_3$ in a range of 20-50 mol %, $Gd_2O_3$ in a range of 0-10 mol % and $SiO_2$ in a range of 0-30 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$. In one embodiment, the ground shield body may be composed of a material that includes 70-75 mol % $Y_2O_3$ and 25-30 mol % $ZrO_2$. In a further embodiment, the ground shield 200 body is composed of a material entitled YZ-20 that includes 73.13 mol % $Y_2O_3$ and 26.87 mol % $ZrO_2$.

Any of the aforementioned porous coatings may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

Figure 2:
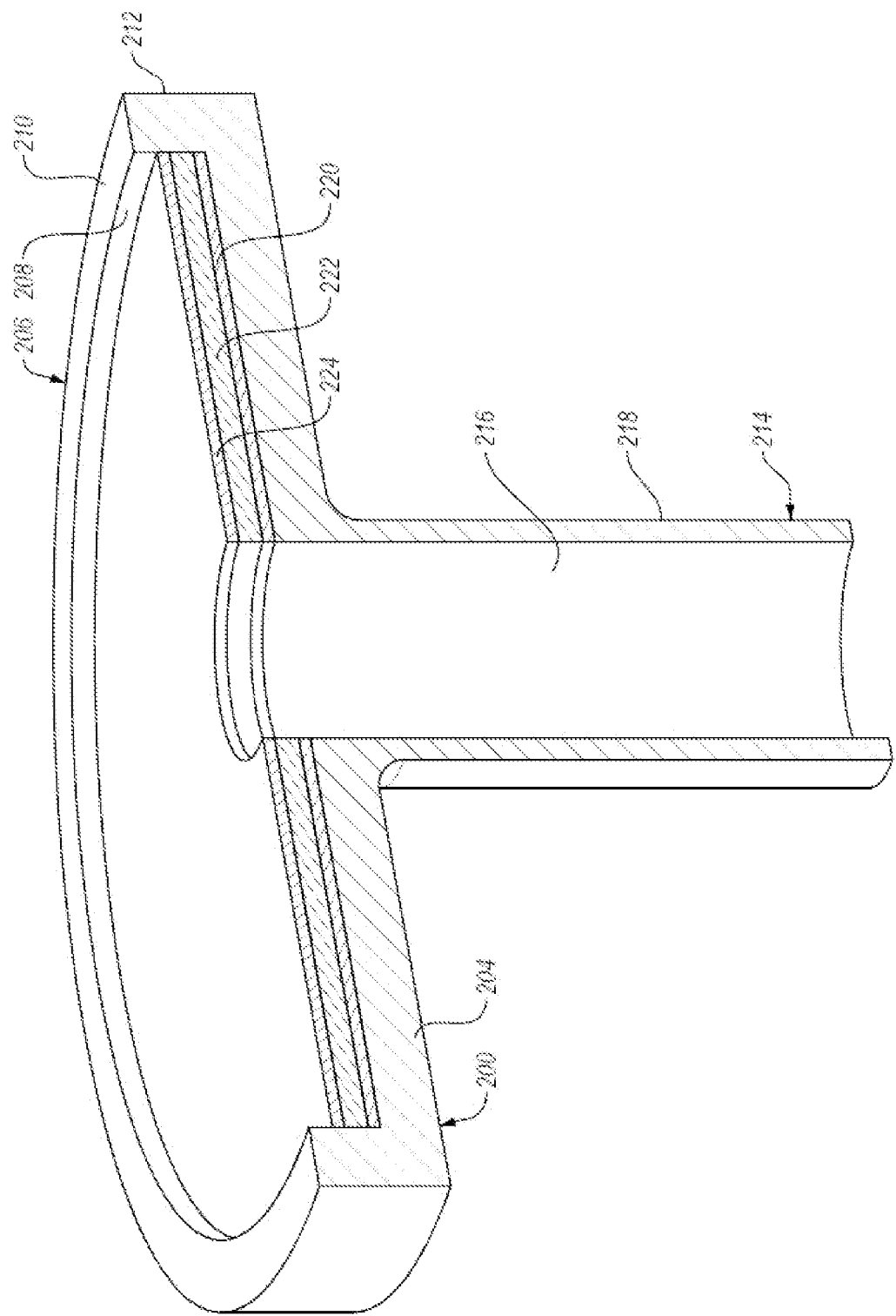
FIG. 2 depicts an exploded view of one embodiment of a ground shield assembly.

FIG. 2 depicts an exploded view of one embodiment of a ground shield 200. Ground shield 200 may correspond with ground shield 149 depicted in FIG. 1. Ground shield may include a plate 204 and a raised edge 206 extending from the upper surface of plate 204. In one embodiment, ground shield 200 further includes a hollow shaft 214 that extends from a lower surface of plate 204. Hollow shaft 214 includes an interior wall 216 and an exterior wall 218.

In one embodiment, plate 204 may have a shape that corresponds approximately to a shape of a heater that is to be protected. For example, a top of the heater may be circular, and plate 204 may have a disc shape, as shown. Plate 204 may have a thickness of between about 0.20 inches to about 2.00 inches.

In one embodiment, plate 204 may have a plurality of holes drilled through plate 204. The plurality of holes may be filled with an electrically conductive plug. The electrically conductive plug may provide a path to ground for an electrically conductive layer on the upper surface of the plate 204. Electrically conductive plugs (e.g., vias) are discussed in greater detail below with reference to FIG. 6.

Raised edge 206 may extend from the upper surface of plate 204 and may include an edge interior wall 208, an edge upper surface 210, and an edge exterior wall 212. Edge interior wall 208 may have a height of between about 0.20 inches to about 2.00 inches. Edge upper surface 210 may have a width of between about 0.05 inches to about 0.50 inches. Edge exterior wall 212 may have a height of between about 0.20 inches to about 4.00 inches. In one embodiment, raised edge 206 may have a shape that corresponds approximately to the shape of the heater that is to be grounded. For example, edge interior wall 208 may have a height that corresponds to the height of the circular disk of the heater that will be encircled by raised edge 206.

In another embodiment, ground shield 200 may further include hollow shaft 214 that extends from the lower surface of plate 204. Hollow shaft 214 may include interior wall 216 and exterior wall 218. In one embodiment, hollow shaft 214 may have a shape that corresponds to the shape of the heater that is to be grounded. For example, interior wall 216 may have a diameter that corresponds, or is slightly larger than, the diameter of the cylindrical shaft of the heater.

In one embodiment, plate 204 and hollow shaft 214 of ground shield 200 may be a single component (e.g., a single sintered ceramic body). Alternatively, plate 204 may be a separate component than hollow shaft 214. In such an embodiment, the plate 204 may be coupled to hollow shaft 214, such as with bolts or other fasteners. In one embodiment, hollow shaft 214 may be composed of two sections, which may be identical or near-identical sections. These sections may come together (e.g., be bolted together) about the shaft of a heater. The combined sections of hollow shaft 214 may then be secured to plate 204.

In one embodiment, ground shield 200 may include a bulk sintered ceramic material. Ground shield 200 may have a composition of one or more of $Al_2O_3$, AlN, Si, SiC, SiN, $ZrO_2$, $Y_3Al_5O_{12}$, $Y_4Al_2O_9$, $Y_5O_4F_7$, $Y_2O_3$, $Er_2O_3$, $Gd_2O_3$, $Gd_3Al_5O_{12}$, $YF_3$, $Nd_2O_3$, $Er_4Al_2O_9$, $Er_3Al_5O_{12}$ (EAG), $ErAlO_3$, $Gd_4Al_2O_9$, $GdAlO_3$, $Nd_3Al_5O_{12}$, $Nd_4Al_2O_9$, or $NdAlO_3$.

In one embodiment, plate 204 and raised edge 206 may not have the same composition as hollow shaft 214. For example, plate 204 and raised edge 206 may be composed of any of the aforementioned bulk sintered ceramic materials, while hollow shaft 214 may be composed of a stronger, metallic material, such as stainless steel or aluminum.

In one embodiment, ground shield 200 is composed of a bulk sintered ceramic material and further includes an electrically conductive layer 220 deposited on at least the upper surface of plate 204 and a first protective layer 222 deposited on at least electrically conductive layer 220.

Electrically conductive layer 220 may have a composition of one or more of Mo, W, Ta, Ti, TC4, Hastelloy®, Inconel®, ITO, or another electrically conductive material that is stable in a high temperature environment. In one embodiment, electrically conductive layer 220 has a composition of a material that provides good oxidation resistance at processing temperatures, such as temperatures of 450° C. or above (e.g., Hastelloy®). Electrically conductive layer 220 may be deposited by traditional atmospheric plasma spray, low pressure plasma spray (LPPS), vacuum plasma spray (VPS), screen printing, wet chemical deposition (e.g., sol gel), physical vapor deposition (PVD), chemical vapor deposition (CVD), aerosol deposition, evaporation, atomic layer deposition (ALD), plasma enhanced chemical vapor deposition (PEVCVD), ion assisted deposition (IAD), ion plating, immersion coating, sputtering, thermal spraying, hot isostatic pressing, cold isostatic pressing, lamination, compression molding, casting, compacting, screen printing, sintering or co-sintering techniques. Electrically conductive layer 220 may have a thickness of between about 0.05 µm and 2.00 mm.

First protective layer 222 may be composed of a plasma resistant ceramic material. First protective layer may have a composition of $Al_2O_3$, $Y_2SiO_5$, $Y_2Si_2O_7$, Ta, $Ta_2O_5$, a titanium alloy (e.g., TC4), SiC, $Y_2O_3$, $Y_4Al_2O_9$, $Y_3Al_5O_{12}$, $YAlO_3$, $Y_5O_4F_7$, Quartz, $Si_3N_4$, AlN, AlON, $TiO_2$, $ZrO_2$, TiC, ZrC, TIN, TiCN, $Y_2O_3$ stabilized $ZrO_2$, and so on. First protective layer 222 may also be composed of a ceramic composite such as $Y_3Al_5O_{12}$ distributed in $Al_2O_3$ matrix, $Y_2O_3$—$ZrO_2$ solid solution or a SiC—$Si_3N_4$ solid solution. First protective layer 222 may also be a ceramic composite that includes a yttrium oxide (also known as yttria and $Y_2O_3$) containing solid solution. For example, first protective layer 222 may be composed of a ceramic composite that is composed of a compound $Y_4Al_2O_9$ and a solid solution $Y_{2-x}Zr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In one embodiment, first protective layer 222 may be composed of a composite ceramic coating including a compound $Y_4Al_2O_9$ and a solid solution $Y_{2-x}Zr_xO_3$ ($Y_2O_3$—$ZrO_2$ solid solution). In a further embodiment, the composition of first protective layer 222 may include 62.93 mol % $Y_2O_3$, 23.23 mol % $ZrO_2$ and 13.94 mol % $Al_2O_3$. In another embodiment, the composite ceramic coating may include $Y_2O_3$ in a range of 50-75 mol %, $ZrO_2$ in a range of 10-30 mol % and $Al_2O_3$ in a range of 10-30 mol %. In other embodiments, other distributions may also be used for the composite ceramic coating. In one embodiment, the composite ceramic is a yttrium oxide containing solid solution that may be mixed with one or more of $ZrO_2$, $Al_2O_3$, or combination thereof.

In one embodiment, first protective layer 222 may be composed of yttrium aluminum garnet (YAG) composed of 35 mol % $Y_2O_3$, 65 mol % $Al_2O_3$. In another embodiment, first protective layer 222 may be composed of YAG composed of 30-40 mol % $Y_2O_3$ and 60-70 mol % $Al_2O_3$.

First protective layer 222 may also be composed of other materials discussed herein above.

First protective layer 222 may be deposited by traditional atmospheric plasma spray, LPPS, VPS, screen printing, wet chemical deposition (e.g., sol gel), PVD, CVD, aerosol deposition, evaporation, PECVD, IAD, Ion plating, immersion coating, sputtering, thermal spraying, hot isostatic pressing, cold isostatic pressing, lamination, compression molding, casting, compacting, screen printing, sintering or co-sintering techniques. In one embodiment, the first protective layer 222 may have a thickness of between about 50.00 nm and about 2.00 mm. In another embodiment, first protective layer 222 may have a thickness of between about 1.00 µm and about 2.00 mm. In one embodiment, first protective layer 222 may have cracks and a porosity of about 0.10-10.0% (e.g., about 0.10-1%, 1-5%, 1-3%, 3-5%, 5-7%, and so on).

In one embodiment, first protective layer 222 may be composed of $Al_2O_3$ and may be deposited by either traditional atmospheric plasma spray, LPPS, or VPS. In a further embodiment, first protective layer 222 may have a porosity of approximately zero (e.g., a porosity of less than 0.1%).

In one embodiment, first protective layer 222 is polished to a certain smoothness. First protective layer 222 may be polished by a grinder or chemical mechanical planarization (CMP) machine. A grinder is a machine having an abrasive disk that grinds and/or polishes a surface of an article. The grinder or CMP machine may grind a surface of first protective layer 222 to decrease the roughness of the layer and/or to reduce the thickness of the layer. In one embodiment, first protective layer 222 may be polished to have an average roughness of less than 0.10 microns or less.

In one embodiment, the material used for first protective layer 222 may be suitably chosen so that a CTE for first protective layer 222 matches the CTE of ceramic ground shield 200 in order to minimize the CTE mismatch between ceramic ground shield 200 and first protective layer 222 and avoid thermo-mechanical stresses which may damage first protective layer 222 during processing. In one embodiment, the CTE for first protective layer 222 has a value difference within approximately 2.5 $10^{-6}$/° C. of the CTE for ceramic ground shield 200 (e.g., for the plate of the ceramic ground shield 200). In one embodiment, ceramic ground shield 200 may be composed of $Al_2O_3$ and first protective layer 222 may be composed of a material that has a CTE difference within approximately 2.5 $10^{-6}$/° C. of the CTE for ceramic ground shield 200.

In a further embodiment, ground shield 200 may be composed of a bulk sintered ceramic material further includes an electrically conductive layer 220 deposited on at least upper surface of the plate 204, a first protective layer 222 deposited on at least the electrically conductive layer 220, and a second protective layer 224 deposited on at least first protective layer 222.

Electrically conductive layer 220 may be composed of any electrically conductive material disclosed herein. First protective layer 222 may be composed of any ceramic material disclosed herein.

Second protective layer 224 may be composed of $Y_2O_3$, $Er_2O_3$, $Ta_2O_5$, $YF_3$, $Al_2O_3$, $AlF_3$, $ZrO_2$, and their combinations. Second protective layer 224 may also be composed of $Y_2SiO_5$, $Y_2Si_2O_7$, Ta, a titanium alloy (e.g., TC4), SiC, $Y_4Al_2O_9$, $Y_3Al_5O_{12}$, YAlO, $Y_5O_4F_7$, Quartz, $Si_3N_4$, AlN, AlON, $TiO_2$, $ZrO_2$, TiC, ZrC, TIN, TiCN, $Y_2O_3$ stabilized $ZrO_2$, and so on. Second protective layer 224 may also be a ceramic composite such as $Y_3Al_5O_{12}$ distributed in $Al_2O_3$ matrix, a $Y_2O_3$—$ZrO_2$ solid solution or a SiC—$Si_3N_4$ solid solution. Second protective layer 224 may also be a ceramic composite that includes a yttrium oxide (also known as yttria and $Y_2O_3$) containing solid solution. For example, second protective layer 224 may be a ceramic composite that is composed of a compound $Y_4Al_2O_9$ and a solid solution $Y_{2-x}Zr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In one embodiment, second protective layer 224 is a composite ceramic coating composed of a compound $Y_4Al_2O_9$ and a solid solution $Y_{2-x}Zr_xO_3$ ($Y_2O_3$—$ZrO_2$ solid solution). In a further embodiment, the composition of second protective layer 224 may include 62.93 mol % $Y_2O_3$, 23.23 mol % $ZrO_2$ and 13.94 mol % $Al_2O_3$. In another embodiment, second protective layer 224 may include $Y_2O_3$ in a range of 50-75 mol %, $ZrO_2$ in a range of 10-30 mol % and $Al_2O_3$ in a range of 10-30 mol %. In other embodiments, other distributions may also be used for the composite ceramic coating. In one embodiment, the composite ceramic is a yttrium oxide containing solid solution that may be mixed with one or more of $ZrO_2$, $Al_2O_3$, or combination thereof.

In one embodiment, second protective layer 224 may be composed of YAG composed of 35 mol % $Y_2O_3$, 65 mol % $Al_2O_3$. In another embodiment, second protective layer 224 can be YAG composed of 30-40 mol % $Y_2O_3$ and 60-70 mol % $Al_2O_3$. Second protective layer 224 may have a porosity between 0.1 and 10.0%.

Second protective layer 224 may also be composed of any of the other materials disclosed herein above with reference to first protective layer 224.

Second protective layer 224 may be deposited by traditional atmospheric plasma spray, LPPS, VPS, screen printing, wet chemical deposition (e.g., sol gel), PVD, CVD, aerosol deposition, evaporation, PEVCVD, IAD, ion plating, immersion coating, sputtering, thermal spraying, hot isostatic pressing, cold isostatic pressing, lamination, compression molding, casting, compacting, screen printing, sintering or co-sintering techniques. In one embodiment, second protective layer 224 may be deposited by ALD.

In one embodiment, second protective layer 224 may have a thickness of between about 50.00 nm and about 2.00 mm or thicker. In another embodiment, second protective layer 224 may have a thickness of between about 1.00 μm and about 2.00 mm. Second protective layer 224 may be a conformal layer and may have a porosity of approximately zero (e.g., a porosity of less than 0.1%). In one embodiment, first protective layer 222 may have cracks and a porosity of about 0.10-10.0% (e.g., about 0.10-1%, 1-5%, 1-3%, 3-5%, 5-7%, and so on). Second protective layer 224 may be a top coat layer that seals the pores and/or cracks in the first protective layer 222. Because second protective layer 224 is very thin, the CTE of second protective layer 224 may not match the CTE of first protective layer 222 or plate 204.

In some embodiments, second protective layer 224 is deposited before first protective layer 222. In such embodiments, second protective layer 224 may protect electrically conductive layer 220 from gases and/or plasmas that penetrate cracks and/or pores in first protective layer 222.

Electrically conductive layer 220, first protective layer 222 and second protective layer 224 are shown as covering the upper surface of the plate 204, in accordance with one embodiment. In alternative embodiments, one or more of electrically conductive layer 220, first protective layer 222 and/or second protective layer 224 may additionally cover the edge interior wall 208, the edge upper surface 210, the edge exterior wall 212, the shaft interior 216, the shaft exterior 218, the lower surface of the plate 204 and/or other surfaces of the ground shield 200. In these embodiments, the electrically conductive layer 220 may provide alternate paths to ground to facilitate the function of ground shield 200. For example, electrically conductive layer 220 may cover shaft interior wall 216 or shaft exterior 218. Some embodiments are shown below with reference to FIGS. 3A-5E.

In one embodiment, the material for first protective layer 222 may be suitably chosen for its resistance to a chlorine gas processing environment. For example, first protective layer 222 may be composed of a titanium alloy (e.g., TC4), Hastelloy®, or any other chlorine resistant materials with target CTE values. In one embodiment, the material for second protective layer 224 may also be suitably chosen for its resistance to a chlorine gas processing environment and may be composed of any of the chlorine resistant materials described above that have target CTE values.

In one embodiment, the material for first protective layer 222 may be suitably chosen for its resistance to a fluorine gas processing environment. For example, first protective layer 222 may be composed of $YF_3$, $AlF_3$, $Er_2O_3$, or any other fluorine resistant materials. In one embodiment, the material for second protective layer 224 may also be suitably chosen for its resistance to a fluorine gas processing environment and may be composed of any of the fluorine resistant materials described above that have target CTE values.

In a further embodiment, ground shield 200 may further include a third protective layer (not shown) that is deposited on second protective layer 224. The third protective layer may be composed of $Y_2O_3$, $Er_2O_3$, $Ta_2O_3$, $YF_3$, $Al_2O_3$, $AlF_3$, $ZrO_2$, and their combinations. In one embodiment, the third protective layer may have cracks and a porosity of about 0.10-10.0% (e.g., about 0.10-1%, 1-5%, 1-3%, 3-5%, 5-7% and so on). In another embodiment, the third protective layer may be a conformal layer and may have a porosity of approximately zero (e.g., a porosity of less than 0.1%).

The third protective layer may be deposited by traditional atmospheric plasma spray, LPPS, VPS, screen printing, wet chemical deposition (e.g., sol gel), PVD, CVD, ALD, aerosol deposition, evaporation, PECVD, IAD, ion plating, immersion coating, sputtering, thermal spraying, hot isostatic pressing, cold isostatic pressing, lamination, compression molding, casting, compacting, screen printing, sintering or co-sintering techniques. The third protective layer may have a thickness of between about 50 nm to 5 μm or thicker. The third protective layer may be a conformal layer.

In one embodiment, ground shield 200 may be composed of an electrically conductive material and may further include a first protective layer 222 deposited on at least the upper surface of plate 204 and a second protective coating 224 deposited on the first protective coating 222. In such embodiments, electrically conductive layer 220 may be omitted.

The electrically conductive material may have a composition of one or more of Mo, W, Ta, Hastelloy®, Inconel®, ITO, Si, or SiC, or any other material that is stable in a high temperature environment. In one embodiment, an electrically conductive metal matrix composite (MMC) material is used for ground shield 200. The MMC material includes a metal matrix and a reinforcing material which is embedded and dispersed throughout the matrix. The metal matrix may include a single metal or two or more metals or metal alloys. Metals which may be used include but are not limited to aluminum (Al), magnesium (Mg), titanium (Ti), cobalt (Co), cobalt-nickel alloy (CoNi), nickel (Ni), chromium (Cr), gold (Au), silver (Ag) or various combinations thereof. The reinforcing material may be selected to provide the desired structural strength for the MMC, and may also be selected to provide desired values for other properties of the MMC, such as thermal conductivity and CTE, for example. Examples of reinforcing materials which may be used include Si, carbon (C), or SiC, but other materials may also be used.

First protective layer 222 and second protective layer 224 may be composed of any of the appropriate materials discussed herein above.

In one embodiment, the material used for first protective layer 222 may be suitably chosen so that a CTE for first protective layer 222 matches the CTE of electrically conductive ground shield 200 in order to minimize the CTE mismatch between electrically conductive ground shield 200 and first protective layer 222 and avoid thermo-mechanical stresses which may damage first protective layer 222 during processing. In another embodiment, the material used for first protective layer 222 may be suitable chosen so that a CTE for first protective layer 222 substantially matches (e.g., is within $2.5 10^{-6}/°$ C.) the CTE of electrically conductive ground shield 220. In one embodiment, the body of ground shield 200 may be composed of a material suitably chosen so that a CTE for the body of ground shield 200 substantially matches the CTE of $Al_2O_3$ (or one of the other ceramic materials listed above for the first protective layer 222), and first protective layer 222 may be composed of $Al_2O_3$ (or one of the other materials listed above for the first protective layer). For example, the body of ground shield 200 may be composed of a titanium alloy (e.g., TC4), which has a CTE that matches the CTE of $Al_2O_3$, and first protective layer 222 is composed of $Al_2O_3$. In another embodiment, the body of ground shield 200 may be composed of a material suitably chosen so that a CTE for the body of ground shield 200 may be within $2.5\ 10^{-6}/°$ C. of the CTE of $Al_2O_3$. In another embodiment, the body of ground shield 200 may be composed of SiC and first protective layer 222 is composed of $Y_2SiC$ or $Y_2Si_2O_7$.

FIGS. 3A-3D illustrate cross sectional side views of various embodiments for a ceramic ground shield 200 including the structure shown in FIG. 2 with electrically conductive layer 220 and first protective layer 222. FIG. 3A depicts one embodiment wherein electrically conductive layer 302 may be deposited on the upper surface of the plate 204. First protective layer 304 may be deposited on electrically conductive layer 302. FIG. 3B depicts an alternative embodiment wherein electrically conductive layer 302 may be further deposited on edge interior wall 208 and edge upper surface 210. First protective layer 304 may be deposited on electrically conductive layer 302. FIG. 3C depicts another alternative embodiment wherein electrically conductive layer 302 may be deposited on the upper surface of the plate 204 and on the interior wall 216 of the hollow shaft 214. First protective layer 304 may be deposited on electrically conductive layer 302. FIG. 3D depicts another alternative embodiment wherein electrically conductive layer 302 may be deposited on the upper surface of plate 204, edge interior wall 208, edge upper surface 210, edge exterior wall 212, the lower surface of plate 204 and exterior wall 218 of hollow shaft 214.

In further embodiments, electrically conductive layer 302 and first protective layer 304 may completely cover each surface of the ground shield 200 or may cover edge exterior wall 212 and/or the lower surface of plate 204 in addition to any of the surfaces of ground shield 200 that these layers are shown to cover in the illustrated examples. In further embodiments, electrically conductive layer 302 may cover any surfaces of ground shield 200 shown, but first protective layer 304 may completely cover each surface of ground shield 200 or alternatively may cover edge exterior wall 212 and/or the lower surface of plate 204 in addition to any of the surfaces of ground shield 200 that first protective layer 304 is shown to cover in the illustrated examples.

In any of the embodiments depicted in FIGS. 3A-3D, the first protective layer 304 may completely cover electrically conductive layer 302 so that electrically conductive layer 302 may not be exposed to the processing environment of the processing chamber depicted in FIG. 1. This allows electrically conductive layer 302 to avoid corrosion in the presence of a high oxidation and/or corrosive environment. Additionally, in any of the embodiments depicted in FIGS. 3A-3D, first protective layer 304 may be deposited on any surface of the ground shield 200 that is not covered by electrically conductive layer 302. For example, electrically conductive layer 302 may be deposited on upper surface of the plate 204 and first protective layer 304 may be deposited on electrically conductive layer 302 and edge interior wall 208.

In another embodiment not shown, ground shield 200 may be composed of a ceramic material. An electrically conductive layer 302 may be deposited onto the upper surface of plate 204, edge interior wall 208, edge upper surface 210, and edge exterior wall 212. A first protective coating 304 may be deposited on electrically conductive layer 302. In a further embodiment, electrically conductive layer 302 may be also deposited on the lower surface of plate 204. First protective layer 304 may be deposited onto electrically conductive layer 302.

FIGS. 4A-4D illustrate cross sectional side views of various embodiments for a ceramic ground shield 200 including the structure shown in FIG. 2 with an electrically conductive layer 220, a first protective layer 222, and a second protective layer 224. FIG. 4A depicts one embodiment wherein electrically conductive layer 402 may be deposited on the upper surface of plate 204. First protective layer 404 may be deposited on electrically conductive layer 402. Second protective layer 406 may be deposited on first protective layer 404. FIG. 4B depicts an alternative embodiment wherein electrically conductive layer 402 may be deposited on the upper surface of plate 204, edge interior wall 208, and edge upper surface 210. First protective layer 404 may be deposited on electrically conductive layer 402. Second protective layer 406 may be deposited on first protective layer 404. FIG. 4C depicts another alternative embodiment wherein electrically conductive layer 402 may be deposited on the upper surface of plate 204 and interior wall 216 of hollow shaft 214. First protective layer 404 may be deposited on electrically conductive layer 402. Second protective layer 406 may be deposited on first protective layer 404. FIG. 4D depicts another alternative embodiment wherein electrically conductive layer 402 may be deposited on the upper surface of plate 204, edge interior wall 208, edge upper surface 210, edge exterior wall 212, the lower surface of plate 204, and exterior wall 218 of hollow shaft 214. First protective layer 404 may be deposited on electrically conductive layer 402. Second protective layer 406 may be deposited on first protective layer 404. In all embodiments described above, a third protective layer (not shown) may be deposited on second protective layer 406.

In further embodiments, electrically conductive layer 402, first protective layer 404, and second protective layer 406 may completely cover each surface of the ground shield or may cover edge exterior wall 212 and/or the lower surface of plate 204 in addition to any of the surfaces of ground shield 200 that these layers are shown to cover in the illustrated examples. In further embodiments, electrically conductive layer 402 may cover any of the surfaces of ground shield 200 shown, but first protective layer 404 and second protective layer 406 may completely cover each surface of ground shield 200 or, alternatively, may cover edge exterior wall 212 and/or the lower surface of plate 204 in addition to any surfaces of ground shield 200 that first protective layer 404 and second protective layer 406 are shown to cover in the illustrated examples. In further embodiments, electrically conductive layer 402 and first protective layer 404 may cover any of the surfaces of ground shield 200 shown, but second protective layer 406 may completely cover each surface of ground shield 200 or may alternatively cover edge exterior wall 212 and/or the lower surface of plate 204 in addition to any surfaces of ground shield 200 that second protective layer 406 is shown to cover in the illustrated examples.

In any of the embodiments depicted in FIGS. 4A-4D, first protective layer 404 and/or second protective layer 406 may completely cover electrically conductive layer 402 so that electrically conductive layer 402 may not be exposed in the processing environment depicted in FIG. 1. This allows electrically conductive layer 402 to avoid corrosion in the presence of plasma high oxidation and/or corrosive environment. Additionally, in any of the embodiments depicted in FIGS. 4A-4D, first protective layer 404 and/or second protective layer 406 may be deposited on surfaces of ground shield 200 that do not include electrically conductive layer 402. For example, electrically conductive layer 402 may be deposited on the upper surface of plate 204 and first protective layer 404 may be deposited on electrically conductive layer 402 and edge interior wall 208. Additionally, second protective layer 406 may be deposited on first protective layer 404, edge interior wall 208, and may also be deposited on additional surfaces of ground shield 200.

In another embodiment not shown, ground shield 200 may be composed of a ceramic material. An electrically conductive layer 402 may be deposited onto the upper surface of plate 204, edge interior wall 208, edge upper surface 210, and edge exterior wall 212. A first protective layer 404 may be deposited on electrically conductive layer 402. A second protective layer 406 may be deposited onto first protective layer 404. In a further embodiment, electrically conductive layer 402 may also be deposited onto the lower surface of plate 204. First protective layer 404 may be deposited on electrically conductive layer 402. Second protective layer 406 may be deposited on first protective layer 404.

Figure 5E:
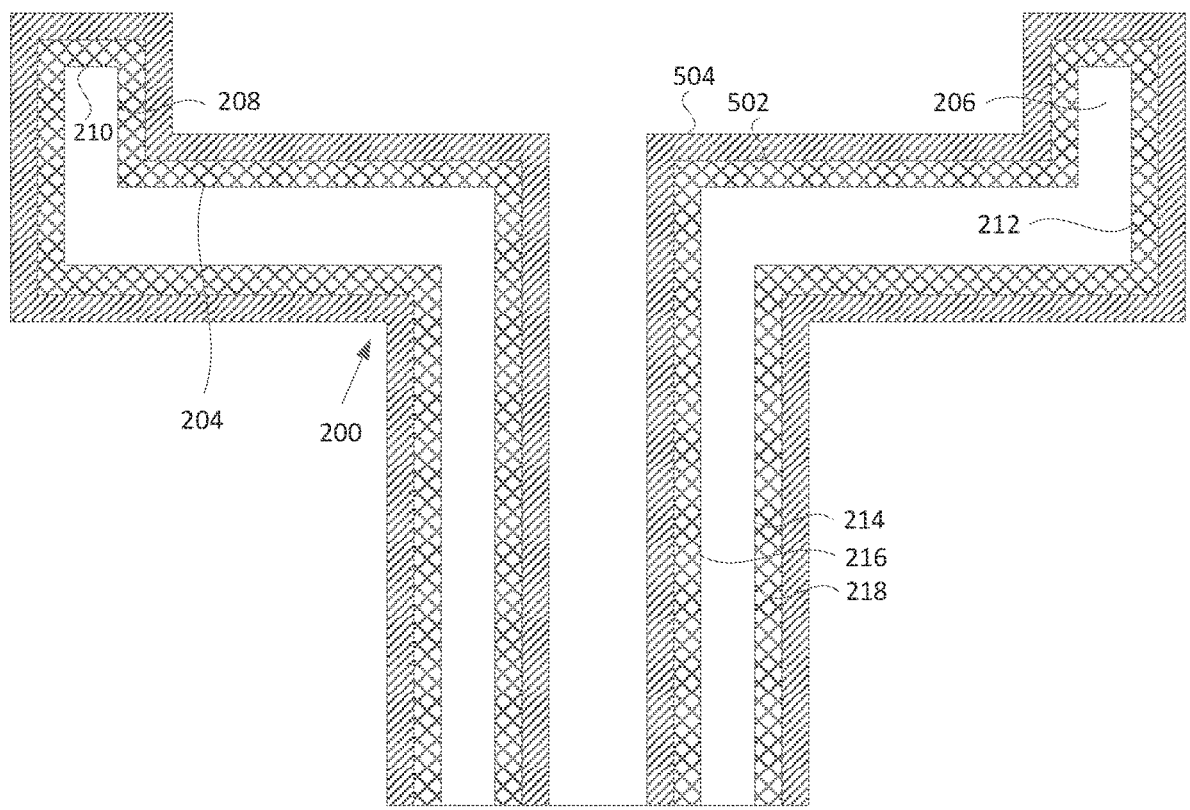
FIG. 5E depicts another sectional side view of one embodiment of an electrically conductive ground shield assembly comprising a first protective layer and a second protective layer.

FIGS. 5A-5E illustrate cross sectional side views of various embodiments for an electrically conductive ground shield 200 including the structure shown in FIG. 2 with first protective layer 222 and second protective layer 224. FIG. 5A depicts one embodiment wherein first protective layer 502 may be deposited on the upper surface of plate 204. Second protective layer 504 may be deposited on first protective layer 502. FIG. 5B depicts an alternative embodiment wherein first protective layer 502 may be deposited on the upper surface of plate 204, edge interior wall 208, and edge upper surface 210. Second protective layer 504 may be deposited on first protective layer 502. FIG. 5C depicts another alternative embodiment wherein first protective layer 502 may be deposited on the upper surface of plate 204 and interior wall 216 of hollow shaft 214. Second protective layer 504 may be deposited on first protective layer 502. FIG. 5D depicts another alternative embodiment wherein first protective layer 502 may be deposited on the upper surface of plate 204, edge interior wall 208, edge upper surface 210, edge exterior wall 212, the lower surface of plate 204, and exterior wall 218 of hollow shaft 214. Second protective layer 504 may be deposited on first protective layer 502. FIG. 5E depicts another alternative embodiment wherein first protective layer 502 may be deposited on all surfaces of ground shield 200. Second protective layer 504 may be deposited on first protective layer 502. First protective layer 502 and/or second protective layer 504 may be deposited on all surfaces of ground shield 200, so to avoid the exposure to the processing environment depicted in FIG. 1. This allows the ground shield 200 to avoid corrosion in the presence of a high oxidation and/or corrosive environment. In all embodiments described above, a third protective layer (not shown) may be deposited on second protective layer 504.

In further embodiments, first protective layer 502 and second protective layer 504 may completely cover the surfaces of ground shield 200 or may cover edge exterior wall 212 and/or the lower surface of plate 204, in addition to any surfaces of ground shield 200 that these layers are shown to cover in the illustrated examples. In further embodiments, first protective layer 502 may cover any surface of ground shield 200 shown, but second protective layer 504 may cover edge exterior wall 212 and/or the lower surface of plate 204 in addition to any surface of ground shield 200 that second protective layer 504 is shown to cover in the illustrated examples.

In any of the embodiments depicted in FIGS. 5A-5E, second protective layer 504 may be deposited on any surface of ground shield 200 that is not covered by first protective layer 502. For example, first protective layer 502 may be deposited on the upper surface of plate 204 and second protective layer 504 may be deposited on first protective layer 502 and edge interior wall 208.

In another embodiment not shown, ground shield 200 may be composed of an electrically conductive material. First protective layer 502 may be deposited on the upper surface of plate 204, edge interior wall 208, edge upper surface 210, and edge exterior wall 212. Second protective layer 504 may be deposited on first protective layer 502. In a further embodiment, first protective layer 502 may be also deposited on the lower surface of plate 204. Second protective layer 504 may be deposited on first protective layer 502. First protective layer 502 and/or second protective layer 504 may be deposited on all surfaces of ground shield 200, so to avoid the exposure to the processing environment of the processing chamber depicted in FIG. 1. This allows ground shield 200 to avoid corrosion in the presence of a high oxidation and/or corrosive environment.

Figure 6:
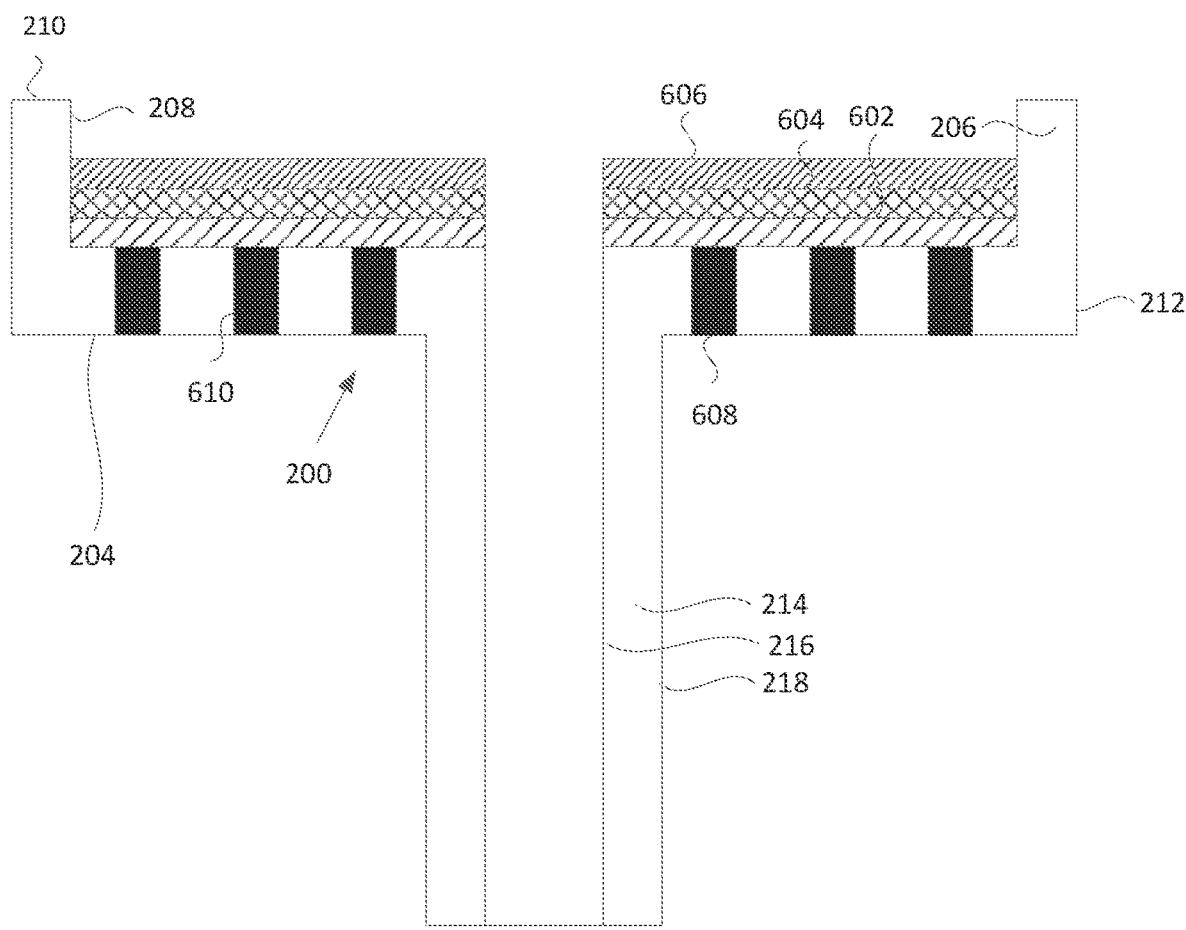
FIG. 6 depicts a sectional view of one embodiment of a ground shield assembly comprising a plurality of holes drilled through the plate of the ground shield wherein the plurality of holes is filled with an electrically conductive plug.

FIG. 6 illustrates a cross sectional side view of one embodiment for a ceramic ground shield 200, wherein a plurality of holes 608 may be drilled through a plate 204 and may be filled with an electrically conductive plug 610. Electrically conductive plug 610 may provide an electrically conductive path for an RF signal.

Electrically conductive plug 610 may have a composition of one or more of Mo, W, Ta, Hastelloy®, Inconel®, ITO, or another electrically conductive material. An electrically conductive layer 602 may be deposited on the upper surface of plate 204 and the surface of electrically conductive plug 610. First protective layer 604 may be deposited on electrically conductive layer 602. Second protective layer 606 may be deposited onto first protective layer 604. First protective layer 604 may have the composition of any ceramic materials described herein. Similarly, second protective layer 606 may have the composition of any ceramic material previously described herein. In alternative embodiments, first protective layer 604 and/or second protective layer 606 may cover additional surfaces of ground shield 200. For example, first protective layer 604 and/or second protective layer 606 may be deposited on at least one of edge interior wall 208, edge upper surface 210, edge exterior wall 212, the lower surface of plate 204, interior wall 216 of hollow shaft 214, and exterior wall 218 of hollow shaft 214.

Figure 7:
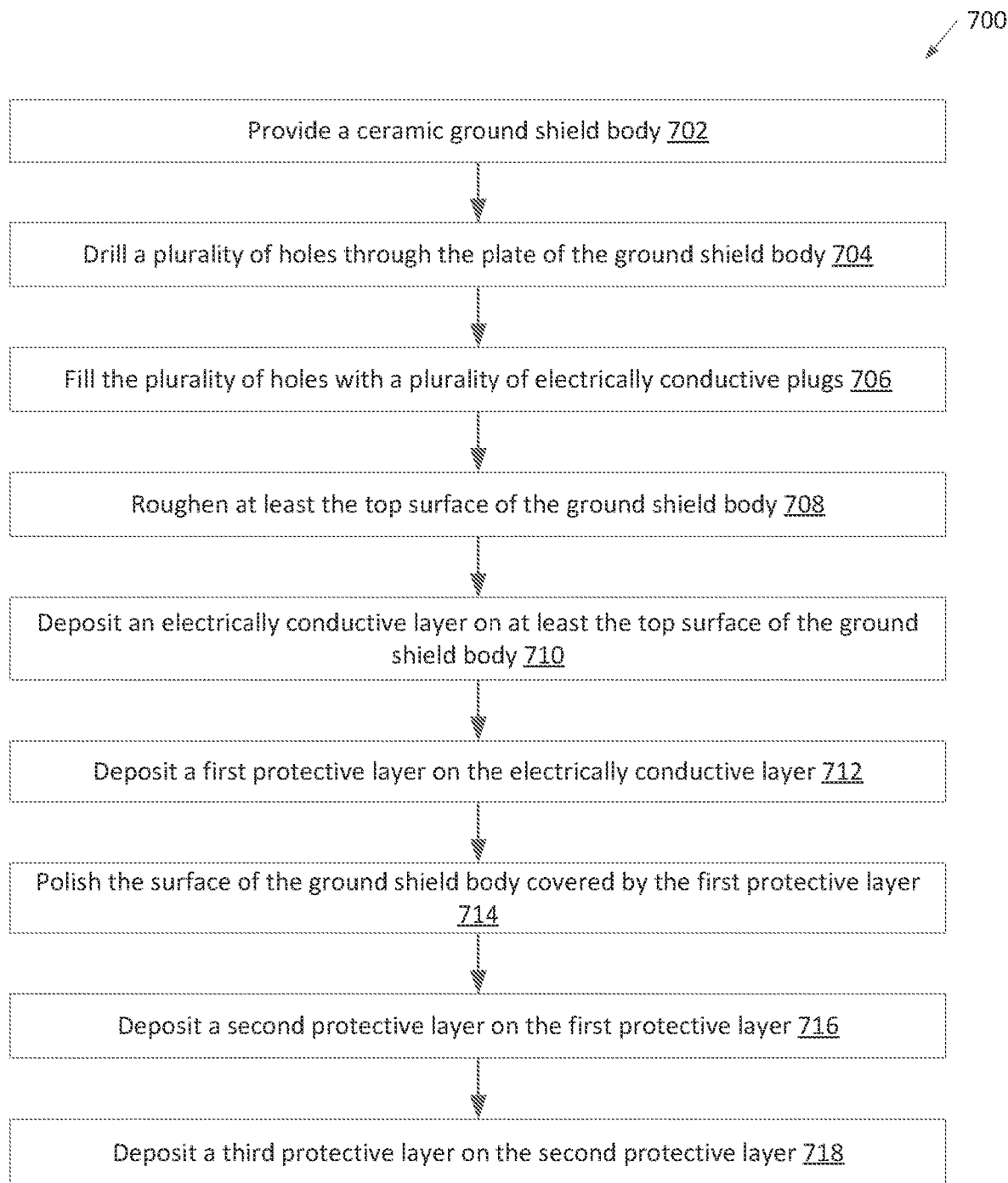
FIG. 7 illustrates a first method for forming a ground shield assembly as described herein.

FIG. 7 illustrates a first process 700 for forming a ground shield. At block 702, a ceramic ground shield body is provided. The provided ceramic ground shield body may be a plate and a raised edge extending from an upper surface of the plate. The raised edge may include an edge interior wall, an edge upper surface, and an edge exterior wall. The ground shield body may further include a hollow shaft that includes an interior wall and an exterior wall. In one embodiment, the ceramic ground shield body is manufactured by performing sintering on a green body approximately having a target size and shape. After the sintering process, the sintered ceramic body may be mechanically processed to achieve target dimensions with a higher degree of accuracy. In one embodiment, the ground shield body may be composed of two or three separate components. These components may be sintered and further processed separately. Alternatively, one or more of the components may not be sintered ceramic materials (e.g., may be metal such as stainless steel). For example, a ground shield plate may be a sintered ceramic and a shaft of the ground shield may be stainless steel or another metal.

At block 704, a plurality of holes may be drilled though a plate of the ground shield body. At block 706, the plurality of holes may be filled with a plurality of electrically conductive plugs. The electrically conductive plugs may connect to leads at the lower surface of the plate, and the leads may connect to ground.

At block 708, at least the upper surface of the ground shield body may be roughened. Roughness on the upper surface of the ground shield body may be achieved through the use of a bead blaster. A bead blaster may be a bead blasting cabinet, a hand held bead blaster, an automatic bead blaster, or any other type of bead blaster. In alternative embodiments, roughness on the upper surface of the ground shield body may be achieved through the use of a motorized abrasive pad. The upper surface of the ground shield body (e.g., the upper surface of the plate) may be roughened to a target roughness of between about 0.10 microns to about 6.00 microns. This may improve adhesion of an electrically conductive layer and/or of a first protective layer to the ground shield body. For example, adhesion of plasma sprayed coatings may be improved by first roughening the surface of the ground shield body.

At block 710, an electrically conductive layer may be deposited on at least the upper surface of the ground shield body. The electrically conductive layer may be composed of any electrically conductive material described herein. The electrically conductive layer may be deposited by traditional atmospheric plasma spray, LPPS, VPS, screen printing, wet chemical deposition (e.g., sol gel), PVD, CVD, aerosol deposition, evaporation, ALD, PECVD, IAD, ion plating, immersion coating, sputtering, thermal spraying, hot isostatic pressing, cold isostatic pressing, lamination, compression molding, casting, compacting, screen printing, sintering or co-sintering techniques.

At block 712, a first protective layer may be deposited on the electrically conductive layer. The first protective layer may be composed of any ceramic material described herein. The first protective layer may be deposited by traditional atmospheric plasma spray, LPPS, VPS, screen printing, wet chemical deposition (e.g., sol gel), CVD, PVD, aerosol deposition, evaporation PECVD, ion assisted deposition, ion plating, and their combinations. If the electrically conductive layer is deposited using techniques such as PVD, CVD, ALD, PECVD or IAD, for example, then the electrically conductive layer may be a conformal layer and the surface of the electrically conductive layer may have approximately the roughness of the underlying ground shield body (e.g., the target roughness of the surface of the ground shield body). Accordingly, if the first protective layer is deposited, for example, by plasma spray or aerosol deposition, then the surface roughness of the electrically conductive layer may improve adhesion of the first protective layer to the electrically conductive layer.

At block 714, the surface of the ground shield body covered by the first protective layer may be polished. Polishing may be performed by a grinder or CMP machine, for example. The first protective layer may be polished to an average surface roughness of between about 0.10 microns to about 2.00 microns.

At block 716, a second protective layer may be deposited on the first protective layer. The second protective layer may be composed of any ceramic material described herein. The second protective layer may be deposited by traditional atmospheric plasma spray, LPPS, VPS, screen printing, wet chemical deposition (e.g., sol gel), PVD, CVD, ALD, aerosol deposition, evaporation, ALD, PECVD, IAD, ion plating, immersion coating, sputtering, thermal spraying, hot isostatic pressing, cold isostatic pressing, lamination, compression molding, casting, compacting, screen printing, sintering or co-sintering techniques. In one embodiment, the second protective layer maybe deposited by a non-line-of-site deposition technique such as ALD or CVD, plasma immersion ion deposition (PIID), wet chemical deposition (e.g., sol gel), or plating. In one embodiment, the second protective layer maybe a conformal protective layer with a porosity of approximately zero that seals any cracks and/or pores in the first protective layer.

At block 718, a third protective layer may be deposited on the second protective layer. The third protective layer may be composed of any ceramic material described herein. The third protective layer may be deposited by traditional atmospheric plasma spray, LPPS, VPS, screen printing, wet chemical deposition (e.g., sol gel), PVD, CVD, ALD, aerosol deposition, evaporation, ALD, PECVD, IAD, ion plating, immersion coating, sputtering, thermal spraying, hot isostatic pressing, cold isostatic pressing, lamination, compression molding, casting, compacting, screen printing, sintering or co-sintering techniques.

If the ground shield body may be composed of multiple different components, then some or all of one or more of the components may have been coated with the electrically conductive layer, the first protective layer, the second protective layer and/or the third protective layer. Subsequently, the multiple components may be assembled. For example, two halves of a ground shield shaft may be attached together around a heater shaft, and the combined halves of the ground shield shaft may be attached to a ground shield plate encircling the heater.

Figure 8:
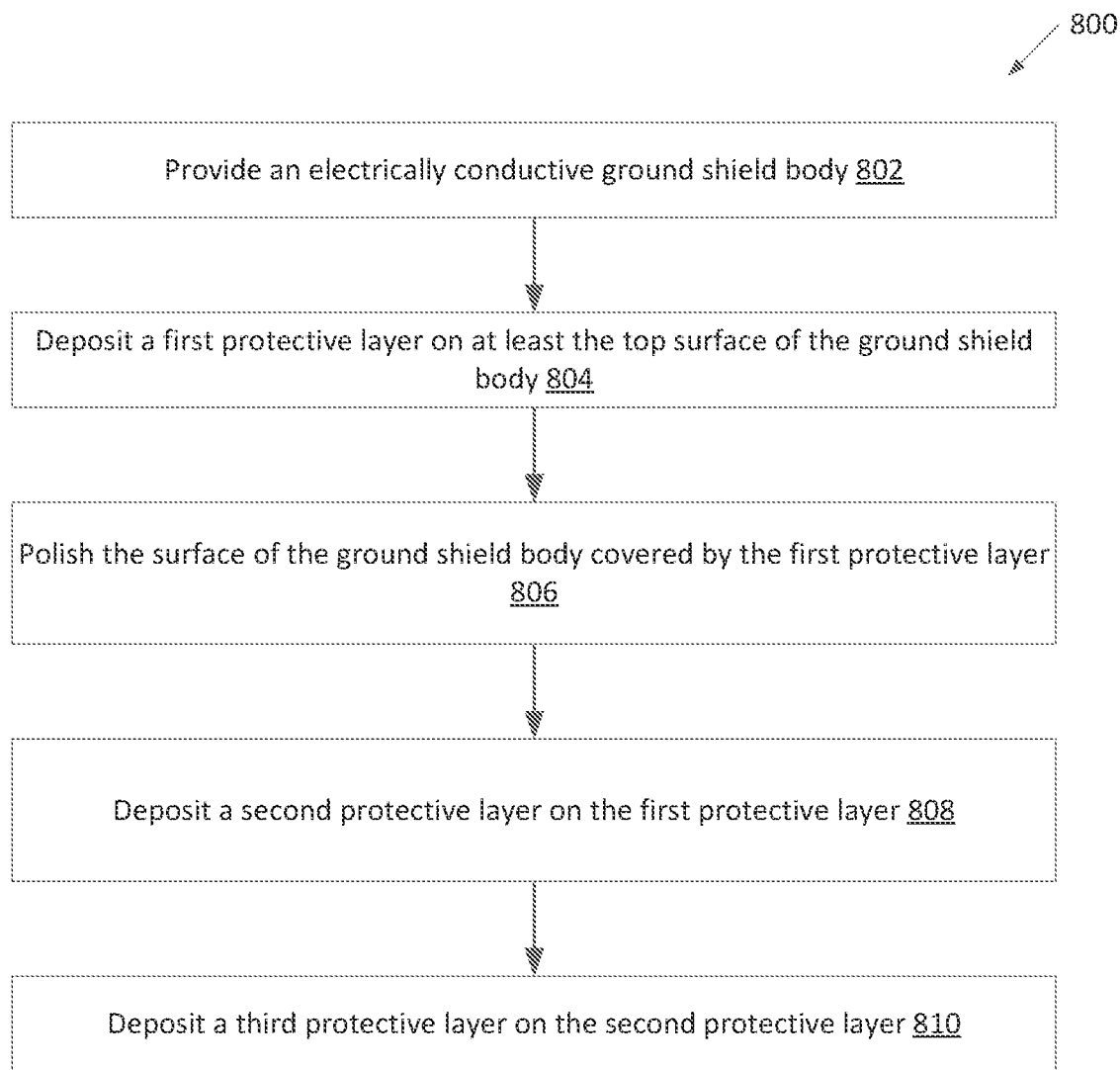
FIG. 8 illustrates a second method of forming a ground shield assembly as described herein.

FIG. 8 illustrates a second process 800 for forming a ground shield. At block 802, an electrically conductive ground shield body is provided. The provided electrically conductive ground shield body may include a plate and a raised edge extending from an upper surface of the plate. The raised edge may include an edge interior wall, an edge upper surface, and an edge exterior wall. The ground shield body may further include a hollow shaft that includes an interior wall and an exterior wall. The electrically conductive ground shield body may be formed by any of the electrically conductive materials described herein for the ground shield body. In one embodiment, the surface of the ground shield body is roughened (e.g., such as by bead blasting).

At block 804, a first protective layer may be deposited on at least the upper surface of the ground shield body. The first protective layer may be composed of any ceramic material described herein. The first protective layer may be deposited by traditional atmospheric plasma spray, LPPS, VPS, screen printing, wet chemical deposition (e.g., sol gel), PVD, CVD, ALD, aerosol deposition, evaporation, PECVD, IAD, ion plating, immersion coating, sputtering, thermal spraying, hot isostatic pressing, cold isostatic pressing, lamination, compression molding, casting, compacting, screen printing, sintering or co-sintering techniques.

At block 806, the surface of the ground shield body covered by the first protective layer may be polished.

At block 808, a second protective layer may be deposited on the first protective layer. The second protective layer may be composed of any ceramic material described herein. The second protective layer may be deposited by traditional atmospheric plasma spray, LPPS, VPS, screen printing, wet chemical deposition (e.g., sol gel), PVD, CVD, ALD, aerosol deposition, evaporation, ALD, PECVD, IAD, ion plating, immersion coating, sputtering, thermal spraying, hot isostatic pressing, cold isostatic pressing, lamination, compression molding, casting, compacting, screen printing, sintering or co-sintering techniques. In one embodiment, the second protective layer is deposited by a non-line-of-site deposition technique such as ALD or CVD, plasma immersion ion deposition (PIID), wet chemical deposition, or plating.

At block 810, a third protective layer may be deposited on the second protective layer. The third protective layer may be composed of any ceramic material described herein. The third protective layer may be deposited by traditional atmospheric plasma spray, LPPS, VPS, screen printing, wet chemical deposition (e.g., sol gel), PVD, CVD, ALD, aerosol deposition, evaporation, ALD, PECVD, IAD, ion plating, immersion coating, sputtering, thermal spraying, hot isostatic pressing, cold isostatic pressing, lamination, compression molding, casting, compacting, screen printing, sintering or co-sintering techniques.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A ground shield of a processing chamber, comprising:
a ceramic body comprising a ground shield plate, a raised edge extending from an upper surface of the ground shield plate, and a hollow shaft that extends from a lower surface of the ground shield plate;
an electrically conductive layer continuously formed on and conforming to at least the upper surface and the raised edge of the ground shield plate and at least one of an exterior surface or an interior surface of the hollow shaft, wherein the electrically conductive layer is connected to ground at one or more points; and
a first protective layer formed on at least the electrically conductive layer, wherein a heater plate of a heater fits within the raised edge and on the ground shield plate such that the heater plate is disposed on top of the first protective layer, the electrically conductive layer, and the upper surface of the ground shield plate.

2. The ground shield of claim 1, further comprising:
a second protective layer deposited on the first protective layer, wherein the second protective layer is conformal, has a thickness of approximately 50.00 nm-2.00 mm, and has a porosity of less than 0.1%.

3. The ground shield of claim 2, wherein the second protective layer comprises at least one yttrium oxide, erbium oxide, tantalum oxide, yttrium fluoride, alumina, aluminum fluoride, zirconium dioxide, a $Y_2O_3$—$ZrO_2$ solid solution, a material comprising $Y_4Al_2O_9$ and a $Y_2O_3$—$ZrO_2$ solid solution, or a combination thereof.

4. The ground shield of claim 1, wherein the electrically conductive layer is further formed on a lower surface of the ground shield plate.

5. The ground shield of claim 1, wherein the first protective layer comprises at least one of alumina, $Y_2SiO_5$, $Y_2Si_2O_7$, $Y_5O_4F_7$, tantalum, silicon carbide, yttria, erbium oxide, a $Y_2O_3$—$ZrO_2$ solid solution, a material comprising $Y_4Al_2O_9$ and a $Y_2O_3$—$ZrO_2$ solid solution, or a combination thereof.

6. The ground shield of claim 1, wherein the first protective layer has a thickness of approximately 1.00 μm-2.00 mm, and has a porosity of 0.1-10.0%.

7. The ground shield of claim 1, wherein:
the ceramic body comprises at least one of alumina, aluminum nitride, silicon, silicon carbide, or silicon nitride; and
the electrically conductive layer comprises at least one of molybdenum, tungsten, nickel, tantalum, an alloy comprising nickel, molybdenum, titanium, and chromium, an alloy comprising nickel, chromium and iron, or indium tin oxide.

8. The ground shield of claim 1, wherein the ceramic body has a first coefficient of thermal expansion (CTE) and the first protective layer has a second CTE value, wherein the second CTE value is within $2.5\times10^{-6}/°$ C. of the first CTE value.

9. The ground shield of claim 1, wherein the ceramic body further comprises a plurality of holes drilled into the ground shield plate, and wherein one or more of the plurality of holes are filled with an electrically conductive plug.

10. A substrate support assembly of a processing chamber, comprising:
a heater comprising a heater plate; and
a ground shield comprising:
a ceramic body comprising a ground shield plate, a raised edge extending from an upper surface of the ground shield plate, and a hollow shaft that extends from a lower surface of the ground shield plate;
an electrically conductive layer continuously formed on and conforming to at least the upper surface and the raised edge of the ground shield plate and at least one of an exterior surface or an interior surface of the hollow shaft, wherein the electrically conductive layer is connected to ground at one or more points; and
a first protective layer formed on at least the electrically conductive layer, and wherein the heater plate of a heater fits within the raised edge and on the ground shield plate such that the heater plate is disposed on top of the first protective layer, the electrically conductive layer, and the upper surface of the ground shield plate.

11. The substrate support assembly of claim 10, wherein the ground shield further comprises:
a second protective layer deposited on the first protective layer, wherein the second protective layer is conformal, has a thickness of approximately 50.00 nm-2.00 mm, and has a porosity of less than 0.1%.

12. The substrate support assembly of claim 11, wherein the second protective layer comprises at least one yttrium oxide, erbium oxide, tantalum oxide, yttrium fluoride, alumina, aluminum fluoride, zirconium dioxide, a $Y_2O_3$—$ZrO_2$ solid solution, a material comprising $Y_4Al_2O_9$ and a $Y_2O_3$—$ZrO_2$ solid solution, or a combination thereof.

13. The substrate support assembly of claim 10, wherein the electrically conductive layer is further formed on at least one of one or more surfaces of the raised edge, a lower surface of the ground shield plate, or an exterior surface of the hollow shaft.

14. The substrate support assembly of claim 10, wherein the first protective layer comprises at least one of alumina, $Y_2SiO_5$, $Y_2Si_2O_7$, $Y_5O_4F_7$, tantalum, silicon carbide, yttria, erbium oxide, a $Y_2O_3$—$ZrO_2$ solid solution, a material comprising $Y_4Al_2O_9$ and a $Y_2O_3$—$ZrO_2$ solid solution, or a combination thereof.

15. The substrate support assembly of claim 10, wherein the first protective layer has a thickness of approximately 1.00 μm-2.00 mm, and has a porosity of 0.1-10.0%.

16. The substrate support assembly of claim 10, wherein:
the ceramic body comprises at least one of alumina, aluminum nitride, silicon, silicon carbide, or silicon nitride; and
the electrically conductive layer comprises at least one of molybdenum, tungsten, nickel, tantalum, an alloy comprising nickel, molybdenum, titanium, and chromium, an alloy comprising nickel, chromium and iron, or indium tin oxide.

17. A ground shield of a processing chamber, comprising:
an electrically conductive body comprising a ground shield plate, a raised edge extending from an upper surface of the ground shield plate, and a hollow shaft that extends form a lower surface of the ground shield plate, wherein the electrically conductive body conforms to the ground shield plate and the raised edge and is connected to ground at one or more points;
a first protective layer formed on at least the upper surface of the ground shield plate and an interior surface of the hollow shaft; and
a second protective layer formed on at least the first protective layer,
wherein a heater plate of a heater fits within the raised edge and on ground shield plate such that the heater plate is disposed on top of the second protective layer.

18. The ground shield of claim 17, wherein the electrically conductive body has a first CTE and the first protective layer has a second CTE value, wherein the second CTE value is the same as the first CTE value.

19. The ground shield of claim 17, wherein the electrically conductive body has a first CTE value and the first protective layer has a second CTE value, wherein the second CTE value is within $2.5\times10^{-6}/°$ C. of the first CTE value.

20. The ground shield of claim 17, wherein:
the first protective layer has a thickness of approximately 1.00 μm-2.00 mm, has a porosity of 0.1-10.0%, and comprises at least one of alumina, $Y_2SiO_5$, $Y_2Si_2O_7$, $Y_5O_4F_7$, tantalum, silicon carbide, yttria, erbium oxide, a $Y_2O_3$—$ZrO_2$ solid solution, a material comprising $Y_4Al_2O_9$ and a $Y_2O_3$—$ZrO_2$ solid solution, or a combination thereof, and the second protective layer is a conformal layer, has a thickness of approximately 50.00 nm-5.00 µm, has a porosity of less than 0.1%, and comprises at least one of yttrium oxide, erbium oxide, tantalum oxide, yttrium fluoride, alumina, aluminum fluoride, zirconium dioxide a $Y_2O_3$—$ZrO_2$ solid solution, a material comprising $Y_4Al_2O_9$ and a $Y_2O_3$—$ZrO_2$ solid solution, or a combination thereof.

* * * * *